(12) United States Patent  
Koyama

(10) Patent No.: US 9,293,174 B2  
(45) Date of Patent: Mar. 22, 2016

(54) SEMICONDUCTOR DEVICE

(71) Applicant: SEMICONDUCTOR ENERGY LABORATORY CO., LTD., Atsugi, Kanagawa-ken (JP)

(72) Inventor: Jun Koyama, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/670,525

(22) Filed: Mar. 27, 2015

(65) Prior Publication Data

US 2015/0200000 A1   Jul. 16, 2015

Related U.S. Application Data

(63) Continuation of application No. 13/783,573, filed on Mar. 4, 2013, now Pat. No. 8,995,218.

(30) Foreign Application Priority Data

Mar. 7, 2012   (JP) .................................. 2012-050085

(51) Int. Cl.
*H01L 27/12* (2006.01)
*G11C 5/14* (2006.01)
(Continued)

(52) U.S. Cl.
CPC .............. *G11C 5/14* (2013.01); *H01L 27/1203* (2013.01); *H01L 29/786* (2013.01); *G06F 1/206* (2013.01); *G06F 1/3203* (2013.01); *G11C 5/148* (2013.01)

(58) Field of Classification Search
CPC ................ H01L 27/1203; H01L 21/84; H01L 29/78696; H01L 29/786; G11C 5/14
USPC .......................................... 257/347, 344, 192
See application file for complete search history.

(56) References Cited

U.S. PATENT DOCUMENTS 4,716,551 A    12/1987  Inagaki
5,289,030 A *  2/1994  Yamazaki ......... H01L 21/76897
                                                        257/410
(Continued)

FOREIGN PATENT DOCUMENTS

EP    1737044 A    12/2006
EP    2226847 A     9/2010
(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Viet Q Nguyen
(74) *Attorney, Agent, or Firm* — Fish & Richardson P.C.

(57) ABSTRACT

To provide a semiconductor device including a plurality of circuit blocks each of which is capable of performing power gating by setting off periods appropriate to temperatures of the respective circuit blocks. Specifically, the semiconductor device includes an arithmetic circuit, a memory circuit configured to hold data obtained by the arithmetic circuit, a power supply control switch configured to control supply of the power supply voltage to the arithmetic circuit, a temperature detection circuit configured to detect the temperature of the memory circuit and to estimate overhead from the temperature, and a controller configured to set a period during which supply of the power supply voltage is stopped in the case where a power consumption of the arithmetic circuit during the period is larger than the overhead period and to control the power supply control switch.

15 Claims, 16 Drawing Sheets

US 9,293,174 B2

Page 2

(51) Int. Cl.
*H01L 29/786* (2006.01)
*G06F 1/20* (2006.01)
*G06F 1/32* (2006.01)

(56) References Cited

U.S. PATENT DOCUMENTS

| | | | | |
|---|---|---|---|---|
| 5,508,209 | A * | 4/1996 | Zhang | H01L 27/1214 257/E21.413 |
| 5,576,556 | A * | 11/1996 | Takemura | H01L 27/1214 257/344 |
| 5,592,008 | A * | 1/1997 | Yamazaki | H01L 27/1214 257/347 |
| 5,620,905 | A * | 4/1997 | Konuma | H01L 21/2026 257/E21.202 |
| 5,731,856 | A | 3/1998 | Kim et al. | |
| 5,744,864 | A | 4/1998 | Cillessen et al. | |
| 5,962,897 | A * | 10/1999 | Takemura | H01L 27/12 257/347 |
| 5,982,460 | A * | 11/1999 | Zhang | G02F 1/136209 349/39 |
| 6,004,831 | A * | 12/1999 | Yamazaki | H01L 27/1255 257/E21.413 |
| 6,013,928 | A * | 1/2000 | Yamazaki | H01L 27/1214 257/344 |
| 6,294,274 | B1 | 9/2001 | Kawazoe et al. | |
| 6,528,820 | B1 * | 3/2003 | Yamazaki | H01L 21/2022 257/347 |
| 6,563,174 | B2 | 5/2003 | Kawasaki et al. | |
| 6,624,450 | B1 * | 9/2003 | Yamazaki | H01L 27/12 257/192 |
| 6,681,336 | B1 | 1/2004 | Nakazato et al. | |
| 6,727,522 | B1 | 4/2004 | Kawasaki et al. | |
| 6,777,763 | B1 * | 8/2004 | Zhang | H01L 27/1214 257/257 |
| 6,924,506 | B2 * | 8/2005 | Zhang | H01L 21/2022 257/255 |
| 7,049,190 | B2 | 5/2006 | Takeda et al. | |
| 7,061,014 | B2 | 6/2006 | Hosono et al. | |
| 7,064,346 | B2 | 6/2006 | Kawasaki et al. | |
| 7,105,868 | B2 | 9/2006 | Nause et al. | |
| 7,135,707 | B1 * | 11/2006 | Ohtani | H01L 21/28114 257/59 |
| 7,135,741 | B1 * | 11/2006 | Yamazaki | H01L 21/2022 257/347 |
| 7,211,825 | B2 | 5/2007 | Shih et al | |
| 7,248,526 | B2 | 7/2007 | Ito et al. | |
| 7,282,782 | B2 | 10/2007 | Hoffman et al. | |
| 7,297,977 | B2 | 11/2007 | Hoffman et al. | |
| 7,323,356 | B2 | 1/2008 | Hosono et al. | |
| 7,327,630 | B2 | 2/2008 | Park | |
| 7,371,623 | B2 * | 5/2008 | Yamazaki | H01L 27/1237 257/E27.111 |
| 7,385,224 | B2 | 6/2008 | Ishii et al. | |
| 7,402,506 | B2 | 7/2008 | Levy et al. | |
| 7,411,209 | B2 | 8/2008 | Endo et al. | |
| 7,453,065 | B2 | 11/2008 | Saito et al. | |
| 7,453,087 | B2 | 11/2008 | Iwasaki | |
| 7,462,862 | B2 | 12/2008 | Hoffman et al. | |
| 7,468,304 | B2 | 12/2008 | Kaji et al. | |
| 7,501,293 | B2 | 3/2009 | Ito et al. | |
| 7,554,869 | B2 | 6/2009 | Kim et al. | |
| 7,573,110 | B1 * | 8/2009 | Ohtani | H01L 29/66757 257/347 |
| 7,630,267 | B2 | 12/2009 | Chen | |
| 7,674,650 | B2 | 3/2010 | Akimoto et al. | |
| 7,732,819 | B2 | 6/2010 | Akimoto et al. | |
| 7,795,950 | B2 * | 9/2010 | Igarashi | 327/513 |
| 7,894,291 | B2 | 2/2011 | Braceras et al. | |
| 7,908,505 | B2 * | 3/2011 | Malik et al. | 713/340 |
| 7,940,112 | B2 | 5/2011 | Okuno et al. | |
| 8,009,418 | B2 * | 8/2011 | Hosokawa | 361/679.52 |
| 8,049,275 | B2 * | 11/2011 | Yamazaki | H01L 21/28114 257/336 |
| 8,111,575 | B2 * | 2/2012 | Mori et al. | 365/222 |
| 8,179,650 | B2 * | 5/2012 | Watanabe et al. | 361/93.1 |
| 8,198,680 | B2 * | 6/2012 | Ishikawa | H01L 29/78675 257/347 |
| 8,243,407 | B2 * | 8/2012 | Fukami | 361/78 |
| 8,279,696 | B2 * | 10/2012 | Shinozaki | 365/206 |
| 8,635,595 | B2 * | 1/2014 | Melillo | G06F 9/465 717/120 |
| 8,700,930 | B2 | 4/2014 | Akiyama | |
| 8,768,645 | B2 | 7/2014 | Van Rijnswou | |
| 8,868,942 | B2 * | 10/2014 | Koshimizu | 713/300 |
| 8,995,218 | B2 * | 3/2015 | Koyama | 365/227 |
| 9,048,321 | B2 * | 6/2015 | Kurata | H01L 29/7869 |
| 2001/0046027 | A1 | 11/2001 | Tai et al. | |
| 2002/0056838 | A1 | 5/2002 | Ogawa | |
| 2002/0132454 | A1 | 9/2002 | Ohtsu et al. | |
| 2003/0189401 | A1 | 10/2003 | Kido et al. | |
| 2003/0218222 | A1 | 11/2003 | Wager, III et al. | |
| 2004/0038446 | A1 | 2/2004 | Takeda et al. | |
| 2004/0127038 | A1 | 7/2004 | Carcia et al. | |
| 2005/0017302 | A1 | 1/2005 | Hoffman | |
| 2005/0199959 | A1 | 9/2005 | Chiang et al. | |
| 2006/0035452 | A1 | 2/2006 | Carcia et al. | |
| 2006/0043377 | A1 | 3/2006 | Hoffman et al. | |
| 2006/0091793 | A1 | 5/2006 | Baude et al. | |
| 2006/0108529 | A1 | 5/2006 | Saito et al. | |
| 2006/0108636 | A1 | 5/2006 | Sano et al. | |
| 2006/0110867 | A1 | 5/2006 | Yabuta et al. | |
| 2006/0113536 | A1 | 6/2006 | Kumomi et al. | |
| 2006/0113539 | A1 | 6/2006 | Sano et al. | |
| 2006/0113549 | A1 | 6/2006 | Den et al. | |
| 2006/0113565 | A1 | 6/2006 | Abe et al. | |
| 2006/0169973 | A1 | 8/2006 | Isa et al. | |
| 2006/0170111 | A1 | 8/2006 | Isa et al. | |
| 2006/0197092 | A1 | 9/2006 | Hoffman et al. | |
| 2006/0208977 | A1 | 9/2006 | Kimura | |
| 2006/0228974 | A1 | 10/2006 | Thelss et al. | |
| 2006/0231882 | A1 | 10/2006 | Kim et al. | |
| 2006/0238135 | A1 | 10/2006 | Kimura | |
| 2006/0244107 | A1 | 11/2006 | Sugihara et al. | |
| 2006/0284171 | A1 | 12/2006 | Levy et al. | |
| 2006/0284172 | A1 | 12/2006 | Ishii | |
| 2006/0292777 | A1 | 12/2006 | Dunbar | |
| 2007/0024187 | A1 | 2/2007 | Shin et al. | |
| 2007/0046191 | A1 | 3/2007 | Saito | |
| 2007/0052025 | A1 | 3/2007 | Yabuta | |
| 2007/0054507 | A1 | 3/2007 | Kaji et al. | |
| 2007/0090365 | A1 | 4/2007 | Hayashi et al. | |
| 2007/0108446 | A1 | 5/2007 | Akimoto | |
| 2007/0152217 | A1 | 7/2007 | Lai et al. | |
| 2007/0172591 | A1 | 7/2007 | Seo et al. | |
| 2007/0187678 | A1 | 8/2007 | Hirao et al. | |
| 2007/0187760 | A1 | 8/2007 | Furuta et al. | |
| 2007/0194379 | A1 | 8/2007 | Hosono et al. | |
| 2007/0252928 | A1 | 11/2007 | Ito et al. | |
| 2007/0272922 | A1 | 11/2007 | Kim et al. | |
| 2007/0287296 | A1 | 12/2007 | Chang | |
| 2008/0006877 | A1 | 1/2008 | Mardilovich et al. | |
| 2008/0038882 | A1 | 2/2008 | Takechi et al. | |
| 2008/0038929 | A1 | 2/2008 | Chang | |
| 2008/0050595 | A1 | 2/2008 | Nakagawara et al. | |
| 2008/0073653 | A1 | 3/2008 | Iwasaki | |
| 2008/0083950 | A1 | 4/2008 | Pan et al. | |
| 2008/0106191 | A1 | 5/2008 | Kawase | |
| 2008/0128689 | A1 | 6/2008 | Lee et al. | |
| 2008/0129195 | A1 | 6/2008 | Ishizaki et al. | |
| 2008/0166834 | A1 | 7/2008 | Kim et al. | |
| 2008/0182358 | A1 | 7/2008 | Cowdery-Corvan et al. | |
| 2008/0224133 | A1 | 9/2008 | Park et al. | |
| 2008/0254569 | A1 | 10/2008 | Hoffman et al. | |
| 2008/0258139 | A1 | 10/2008 | Ito et al. | |
| 2008/0258140 | A1 | 10/2008 | Lee et al. | |
| 2008/0258141 | A1 | 10/2008 | Park et al. | |
| 2008/0258143 | A1 | 10/2008 | Kim et al. | |
| 2008/0296568 | A1 | 12/2008 | Ryu et al. | |
| 2009/0068773 | A1 | 3/2009 | Lai et al. | |
| 2009/0073325 | A1 | 3/2009 | Kuwabara et al. | |
| 2009/0106572 | A1 | 4/2009 | Taguchi et al. | |
| 2009/0114910 | A1 | 5/2009 | Chang | |
| 2009/0134399 | A1 | 5/2009 | Sakakura et al. | |
| 2009/0152506 | A1 | 6/2009 | Umeda et al. | |

(56) References Cited

U.S. PATENT DOCUMENTS

| | | | |
|---|---|---|---|
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0161718 A1* | 6/2012 | Nishida | 320/150 |
| 2012/0273773 A1 | 11/2012 | Ieda et al. | |
| 2012/0274356 A1 | 11/2012 | Takahashi | |
| 2012/0293202 A1 | 11/2012 | Nishijima et al. | |
| 2012/0293209 A1 | 11/2012 | Takewaki | |
| 2013/0134416 A1 | 5/2013 | Nishijima et al. | |
| 2013/0134800 A1* | 5/2013 | Kim | 307/117 |
| 2014/0184165 A1 | 7/2014 | Takahashi et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-268694 A | 9/2005 |
| JP | 2009-116851 A | 5/2009 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 28, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9 and 16) in the In2O3—ZnGa2O—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", Nirim Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystaline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

Writing data into memory

Reading data from memory

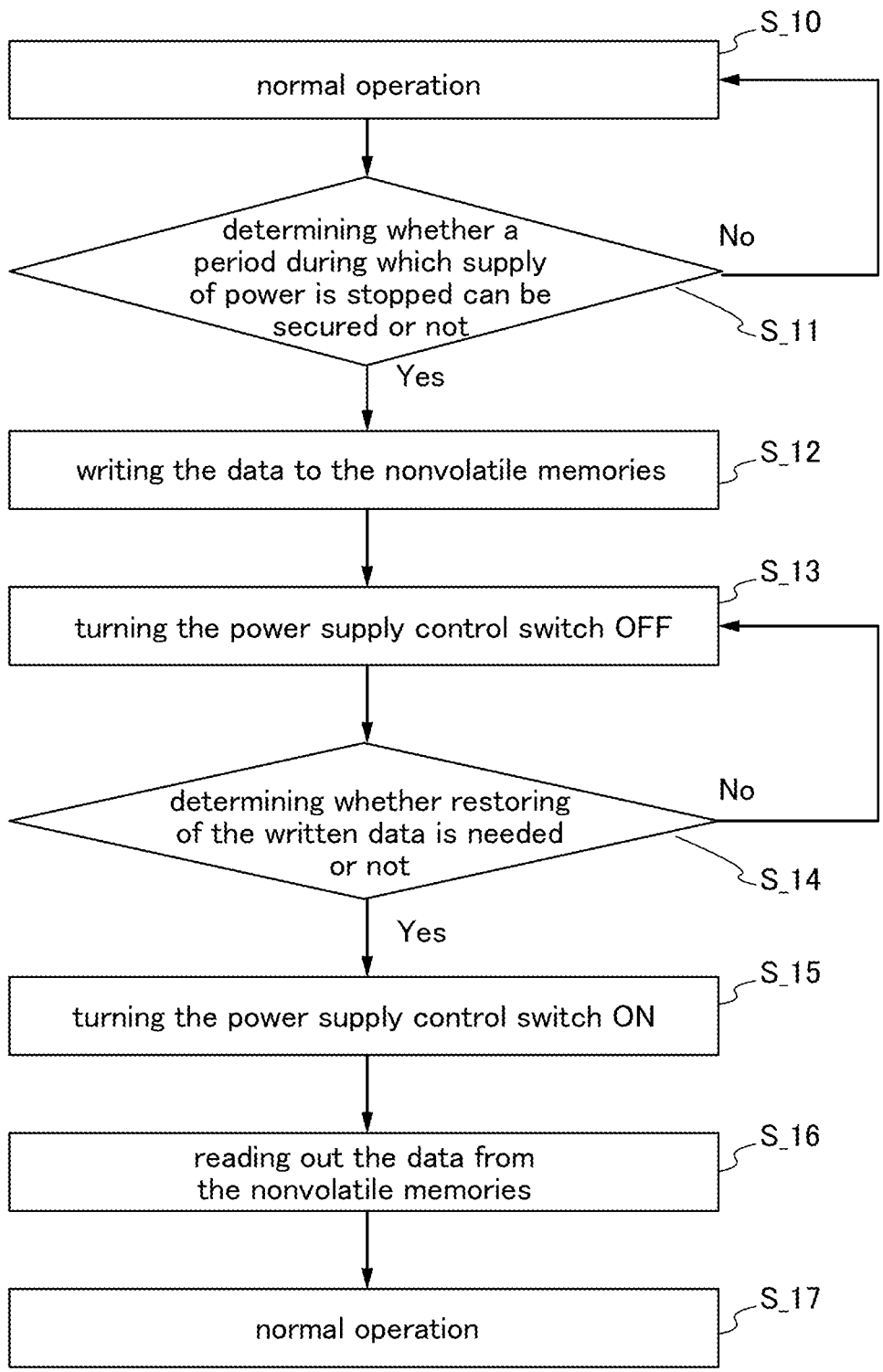

SEMICONDUCTOR DEVICE

CROSS-REFERENCE TO RELATED APPLICATIONS

This application is a continuation of U.S. application Ser. No. 13/783,573, filed Mar. 4, 2013, now allowed, which claims the benefit of a foreign priority application filed in Japan as Serial No. 2012-050085 on Mar. 7, 2012, both of which are incorporated by reference.

BACKGROUND OF THE INVENTION

1. Field of the Invention

The present invention relates to a semiconductor device.

Note that a semiconductor device in this specification refers to general devices which can function by utilizing semiconductor characteristics; for example, a semiconductor integrated circuit including a semiconductor element such as a transistor, an electro-optical device such as a display device, and an electronic device are all semiconductor devices.

2. Description of the Related Art

The scale of semiconductor integrated circuits including logic circuits has increased year by year. Integrated circuits were constituted by several elements at an early stage of development; nowadays, there are central processing units (CPUs) and digital signal processors (DSPs) constituted by tens of millions of elements.

Although power consumption per element is reduced by miniaturization and reduction in driving voltage of elements included in such CPUs and DSPs, power consumption of the entire integrated circuit is being increased because the number of elements is more increased.

As a method for reducing power consumption of the integrated circuit, clock gating by which clocks are partly stopped, a method for lowering the clock frequency, and a method for lowering power supply voltage partly have been developed.

Power consumption includes static power due to leakage current of an element such as a transistor in the off state, as well as dynamic power due to charge and discharge caused by switching of the element. The static power can be almost negligible in integrated circuits with a small number of elements, but is too high to ignore in integrated circuits with an enormous number of elements. Thus, for an integrated circuit with high static power, the following method (power gating) is developed: supply of a power supply voltage to circuits in the integrated circuit is controlled by switches (also referred to as power supply control switches or power gates). By this method, static power due to leakage current of an element such as a transistor can be reduced, and moreover, power consumption of the integrated circuit can be reduced.

For example, Patent Document 1 discloses a semiconductor integrated circuit that can implement power gating. Specifically, Patent Document 1 discloses a semiconductor integrated circuit that includes a transistor between a logic circuit and a power supply line, and can control supply of a power supply voltage to the logic circuit by controlling switching of the transistor.

In addition, Patent Document 2 discloses a microcomputer or the like which can stop supply of a power supply voltage to a CPU, a memory, and the like in a period during which supplying power is not necessary, for example.

REFERENCE

Patent Document

[Patent Document 1] Japanese Published Patent Application No. 2005-268694

[Patent Document 2] Japanese Published Patent Application No. 2009-116851

SUMMARY OF THE INVENTION

In the case where power consumption of an integrated circuit such as a CPU is reduced by power gating, extra power is consumed as overhead at a time of transmitting data to a semiconductor memory device having nonvolatility (such a memory device is also referred to as a nonvolatile memory) in the integrated circuit. Specifically, in writing and reading processes of the nonvolatile memory, extra power is consumed as overhead.

Here, an example of power gating is described with reference to a flow chart shown in FIG. 15.

First, an integrated circuit which includes a power supply control switch and be capable of power gating operates at a constant speed. Note that this operation is called normal operation for convenience (step S_10).

In the case where supply of power is provided but processing is not performed in, for example, an arithmetic circuit in the integrated circuit under normal operation, whether a period during which supply of power to the arithmetic circuit is stopped (power-off period) can be secured or not is determined (step S_11). Since the power-off period can be secured while the arithmetic circuit is not operating (e.g., operation clock is not input), this determination depends on a relation between the operation speed of the arithmetic circuit and overhead at the time of writing or reading data to/from the nonvolatile memory. In the case where the power-off period with respect to the arithmetic circuit is secured, before the power-off period starts, data obtained by the arithmetic circuit is written to a nonvolatile memory (steps S_12). Note that in the case where the power-off period with respect to the arithmetic circuit is not secured, normal operation continues (step S_10).

After the data is written to the nonvolatile memory, the power supply control switch provided between the arithmetic circuit and a power supply is turned off, whereby supply of power to the arithmetic circuit is stopped (step S_13).

After the power supply control switch is turned off, whether restoring of the written data is needed or not is determined (step S_14). This determination state lasts until the arithmetic circuit is made to operate again. In the case where the arithmetic circuit is not made to operate again and restoring of the data is not necessary, the power gate remains off (step S_13). Thus, power is not supplied to the arithmetic circuit until the arithmetic circuit is made to operate again.

Then, in the case where the restoring of the data is necessary, e.g., the case where the arithmetic circuit is made to operate again, the power supply control switch is turned on, so that the supply of power to the arithmetic circuit is restarted (step S_15).

Then, the transferred data is read from the nonvolatile memory and restored in the arithmetic circuit (step S_16), and the normal operation is carried out again (step S_17).

Further, overhead depends on electric characteristics of an element included in the nonvolatile memory. In other words, when the electric characteristics of the element changes with fluctuation of temperatures of a chip including a semiconductor integrated circuit, the amount of overhead also fluctuates.

Thus, in the above power gating, whether supply of power to the semiconductor integrated circuit is stopped or not is determined considering the case of the poorest electric characteristics including temperature dependency of the element. FIGS. 16A to 16C show relations between the power gating and overhead. Note that in each of FIGS. 16A to 16C, the horizontal axis indicates time, and the vertical axis indicates consumed power. Specifically, FIG. 16A shows the case of Condition 1 where the condition indicates temperatures of a semiconductor memory device with nonvolatility (also referred to as nonvolatile memory) and a peripheral circuit controlling the nonvolatile memory; FIG. 16B shows the case of Condition 2; and FIG. 16C shows the case of Condition 3. Among them, Condition 1 has the lowest temperatures of the nonvolatile memory and the peripheral circuit, which is followed by Condition 2 and Condition 3. Condition 3 has the lowest operation speeds of the nonvolatile memory and the peripheral circuit, which is followed by Condition 2 and Condition 1.

In FIGS. 16A to 16C, regions represented as "a" and "b" mean overhead, and a region represented as "c" means power which can be reduced by power gating. In order to reduce power consumption by performing power gating, it is necessary that the amount of consumed power which can be reduced by power gating be larger than the sum of overhead; in FIGS. 16A to 16C, the relation a+b<c needs to be satisfied. The case where the above relation is not satisfied leads to an increase in power consumption.

Further, the higher the temperatures of the nonvolatile memory and the peripheral circuit are, the more increased overhead of the nonvolatile memory is. The amount of overhead under Condition 3 shown in FIG. 16C is largest; in that case, the relation a+b<c is satisfied, whereby power consumption of the semiconductor integrated circuit can be reduced. In the above power gating, when the relation a+b<c is satisfied under the condition where the electric characteristics of an element are poor, i.e., the amount of overhead is large, supply of power is stopped. Therefore, for example, in the case where high speed operation with a small amount of overhead is carried out, supply of power cannot be stopped even when there is a period during which supply of power can be stopped; accordingly, power is constantly supplied during high speed operation. As described above, supply of power is stopped in the case of the largest amount of overhead. Thus, in operation where the temperature is low and the amount of overhead is small, the above relation cannot be satisfied, which leads to a problem in that supply of power cannot be stopped though there is an effect in reducing power consumption by stopping power supply. Since in the above power gating for a reduction in power consumption, a power-off period is set to assume Condition 3, a power-off period cannot be provided in the case such as Condition 1 or Condition 2. Therefore, there is room for further reduction in power consumption.

An object of one embodiment of the present invention is to provide a semiconductor device with low power consumption.

In view of the above object, in one embodiment of the present invention, a plurality of temperature sensors are provided in a semiconductor device which is capable of power gating and includes a plurality of circuit blocks, temperatures of the circuit blocks are detected by the respective temperature sensors, and off periods appropriate to the temperatures are set in the respective circuit blocks. Specifically, the temperature of a memory circuit provided in each circuit block is detected, and an off period appropriate to the temperature is set in each circuit block. Note that the circuit block indicates an assembly including circuits or memory mediums having a function such as arithmetic processing or data retention, in a semiconductor device.

Thus, one embodiment of the present invention is a semiconductor device including an arithmetic circuit, a memory circuit configured to hold data obtained by the arithmetic circuit, a power supply control switch configured to control supply of a power supply voltage to the arithmetic circuit, a temperature detection circuit configured to detect a temperature of the memory circuit and to estimate an overhead from the temperature, and a controller configured to set a period during which the supply of the power supply voltage is stopped in the case where a power consumption of the arithmetic circuit during the period is larger than the overhead and to control the power supply control switch.

Note that in this specification, the term "overhead" indicates extra power consumed at a time of writing and reading data to/from a memory circuit.

Another embodiment of the present invention is a semiconductor device including an arithmetic circuit, a cache memory, a memory circuit configured to hold data obtained by the arithmetic circuit and data stored in the cache memory, a power supply control switch configured to control supply of a power supply voltage to the arithmetic circuit and the cache memory, a temperature detection circuit configured to detect a temperature of the memory circuit and to estimate an overhead from the temperature, and a controller configured to set a period during which the supply of the power supply voltage is stopped in the case where a power consumption of the arithmetic circuit and the cache memory during the period is larger than the overhead and to control the power supply control switch.

In the above semiconductor device, the memory circuit is mainly constituted by semiconductor devices with nonvolatility (also referred to as nonvolatile memory), and examples of the nonvolatile memory include a flash memory including a transistor, a magnetoresistive random access memory using a magnetic tunnel junction (MTJ) element, a resistive random access memory (ReRAM), and a phase change random access memory (PRAM). Further, a transistor with extremely low off-state current is employed for a transistor included in a volatile memory, whereby such a volatile memory can function as a nonvolatile memory and be applied to a nonvolatile memory in the memory circuit. For example, as the transistor with extremely low off-state current, a transistor in which a channel formation region is formed using an oxide semiconductor (hereinafter, referred to as transistor including an oxide semiconductor) is given. In the transistor including an oxide semiconductor, the off-state current can be 100 zA or less per micrometer of the channel width by reducing oxygen vacancies and hydrogen in the oxide semiconductor.

As a power gate used for power gating, a switching element electrically connected to a wiring to which a power supply potential is supplied can be used. For example, as the switching element, a transistor or the like is used. In the case where the transistor is used as a power gate, the power gate may have one transistor or a plurality of transistors. In a structure where a plurality of transistors are provided, the plurality of transistors may be connected to each other in parallel, in series, or in combination of a parallel connection and a series connection. Note that as the transistor included in the power gate, a transistor in which a channel formation region is formed using an oxide semiconductor can be used.

According to one embodiment of the present invention, temperature sensors are provided in circuit blocks in a semiconductor device, temperatures of the circuit blocks are detected by the respective temperature sensors, and an off period (period during which supply of power is stopped) appropriate to each circuit block can be set. Thus, even in the case where supply of power cannot be stopped by the power gating according to the flow chart shown in FIG. 15, a power-off period can be set, so that power consumption of the semiconductor device can be reduced.

For example, even while high speed operation with the small amount of overhead, which has conventionally been incapable of providing a power-off period, is carried out, supply of power can be stopped for an appropriate time. Thus, a semiconductor device according to one embodiment of the present invention can operate at high speed with cutting power consumption.

BRIEF DESCRIPTION OF THE DRAWINGS

FIG. 15 shows an example of power gating.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

In this specification, the contents in different embodiments can be combined with each other as appropriate. In addition, the contents of the embodiments can be replaced with each other as appropriate.

Further, the ordinal numbers such as "first" and "second" are used to avoid confusion between components and do not limit the number of each component.

Embodiment 1

First, a structure example of a semiconductor device which is one embodiment of the present invention will be described with reference to FIG. 1. Note that in this embodiment, a processor is described as an example of a semiconductor device which is one embodiment of the present invention.

Figure 1:
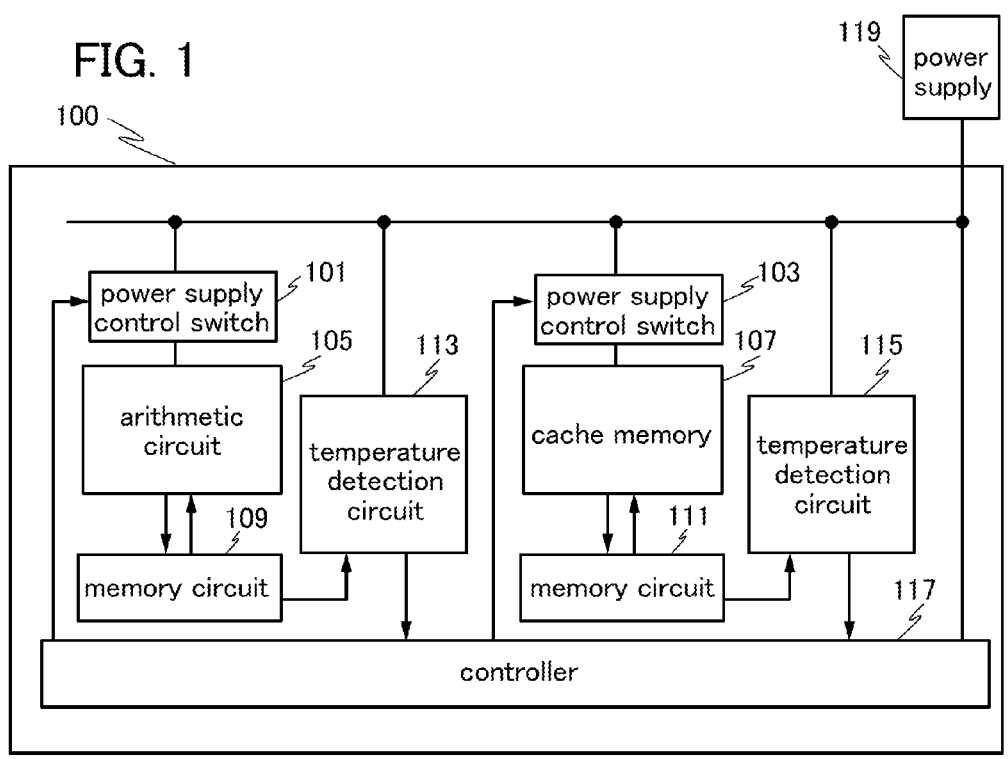
FIG. 1 illustrates an example of a semiconductor device.

FIG. 1 is a block diagram of a processor 100. The processor 100 includes an arithmetic circuit 105 and a cache memory 107. The processor 100 includes a power supply control switch 101 functioning as a power gate between a power supply 119 and the arithmetic circuit 105 and a power supply control switch 103 functioning as a power gate between the power supply 119 and the cache memory 107. The processor 100 includes a controller 117 which controls the power supply control switch 101 and the power supply control switch 103. The processor 100 includes a memory circuit 109 which holds data obtained by the arithmetic circuit 105 and a memory circuit 111 which holds data stored in the cache memory 107. The processor 100 includes a temperature detection circuit 113 which detects the temperature of the memory circuit 109 and estimates overhead from the temperature and a temperature detection circuit 115 which detects the temperature of the memory circuit 111 and estimates overhead from the temperature. Note that in FIG. 1, the power supply control switch 101 and the power supply control switch 103 are represented by SW. In this embodiment, arrows shown in the drawings indicate the direction in which a signal is transmitted.

The arithmetic circuit 105 is preferably a logic circuit which is used generally and includes at least one of combination circuits such as an AND circuit, an OR circuit, a NAND circuit, and NOR circuit, for example. Note that the arithmetic circuit 105 may have a structure in which a sequential circuit such as a flip-flop is combined with the above combination circuit. Although not illustrated, the arithmetic circuit 105 includes a peripheral circuit which controls arithmetic processing.

The cache memory 107 is preferably a cache memory which is generally used and formed with a combination of sequential circuits such as a flip-flow, and the like. Specifically, a cache memory including an SRAM can be used as the cache memory 107. Although not illustrated, the cache memory 107 includes a peripheral circuit which controls operation of writing, reading, and the like.

The memory circuit 109 and the memory circuit 111 each include a semiconductor memory device with nonvolatility (nonvolatile memory) and an operation circuit which drives the nonvolatile memory. Examples of the nonvolatile memory include a flash memory (including NAND type and NOR type), a magnetoresistive random access memory using a magnetic tunnel junction (MTJ) element, a resistive random access memory (ReRAM), and a phase change random access memory (PRAM). The operation circuit outputs a signal for transmitting data obtained by the arithmetic circuit 105 or data stored in the cache memory 107 to the memory circuit 109 or the memory circuit 111 before supply of the power supply voltage is stopped.

Further, when a transistor with extremely low off-state current is used as a transistor included in a volatile memory, such a volatile memory can function as a nonvolatile memory and be applied to a nonvolatile memories included in the memory circuit 109 and the memory circuit 111. The transistor with extremely low off-state current is, for example, a transistor including an oxide semiconductor, and the details of the transistor including an oxide semiconductor is described later. Note that although the arithmetic circuit 105 and the memory circuit 109 are independently provided in FIG. 1, the arithmetic circuit 105 and the memory circuit 109 may be formed integrally, and the cache memory 107 and the memory circuit 111 may also be formed integrally.

The temperature detection circuit 113 and the temperature detection circuit 115 each include a temperature sensor including a diode and a peripheral circuit controlling the temperature sensor. In the processor 100, the temperature detection circuit 113 which detects the temperature of the memory circuit 109 and estimates overhead from the temperature and the temperature detection circuit 115 which detects the temperature of the memory circuit 111 and estimates overhead from the temperature are provided independently. However, two temperature sensors may be provided in either one of the temperature detection circuits and switched by a switch to detect the temperatures of the memory circuit 109 and the memory circuit 111, thereby deriving overhead from the temperatures. Note that in this specification, overhead which is estimated by the temperature detection circuit 113 and the temperature detection circuit 115 from the temperatures of the memory circuit 109 and the memory circuit 111 can be referred to as temperature data.

For each of the power supply control switch 101 and the power supply control switch 103, a switching element electrically connected to a wiring to which the power supply potential is supplied can be used. Examples of the switching element include a transistor.

Structure examples of the power supply control switch 101 and the power supply control switch 103 are described. In this embodiment, an example of using a transistor is described.

The power supply control switch 101 has a function of controlling supply of the power supply voltage to the arithmetic circuit 105. The power supply control switch 103 has a function of controlling supply of the power supply potential to the cache memory 107.

As transistors included in the power supply control switch 101 and the power supply control switch 103, a transistor with extremely low off-state current may be used. Examples of the transistor with extremely low-off state current include a transistor including an oxide semiconductor (the details are described later).

Each of the power supply control switch 101 and the power supply control switch 103 may have either one transistor or a plurality of transistors. Here, an example of providing a plurality of transistors is described.

Figure 2:
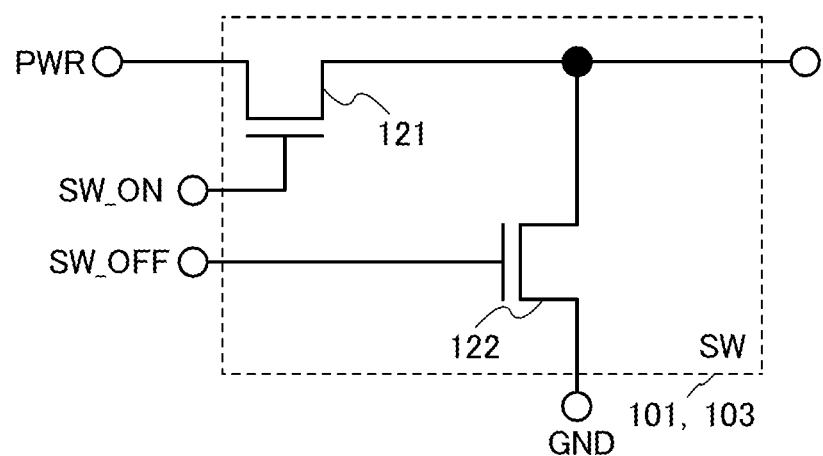
FIG. 2 shows a power supply control switch of a semiconductor device.

FIG. 2 is a circuit diagram of an example of a circuit configuration which can be applied to the power supply control switch 101 and the power supply control switch 103. Each of the power supply control switch 101 and the power supply control switch 103 includes an n-channel transistor 121 and an n-channel transistor 122.

The transistor 121 is provided between the power supply 119 and the arithmetic circuit 105 or the cache memory 107. To a gate of the transistor 121, a control signal SW_ON is input from the controller 117. Whether or not the power supply voltage is supplied to the arithmetic circuit 105 or the cache memory 107 is controlled by turning on or off the transistor 121.

To a gate of the transistor 122, a control signal SW_OFF is input from the controller 117. Whether or not the ground potential is supplied to the arithmetic circuit 105 or the cache memory 107 is controlled by turning on or off the transistor 122.

The power supply control switch in FIG. 2 is on when the transistor 121 is on and the transistor 122 is off. The power supply control switch in FIG. 2 is off when the transistor 121 is off and the transistor 122 is on.

In the case where only one transistor is included in each of the power supply control switch 101 and the power supply control switch 103, only one of the transistor 121 and the transistor 122 is provided in the power supply control switch shown in FIG. 2. For example, in the case where only the transistor 121 is included, the power supply voltage is supplied while the gate of the transistor 121 is supplied with the control signal SW_ON, and supply of the power supply voltage is stopped while the gate of the transistor 121 is not supplied with the control signal SW_ON.

The controller 117 is configured to receive the temperature data of the memory circuit 109 and the memory circuit 111, which is calculated by the temperature detection circuit 113 and the temperature detection circuit 115, and to output a signal for controlling switching (control signal SW_ON or control signal SW_OFF) of the power supply control switch 101 and the power supply control switch 103 in accordance with the temperature data. This is because overhead due to writing and reading processing of the nonvolatile memories included in the memory circuit 109 and the memory circuit 111 varies depending on the temperatures.

Figure 3:
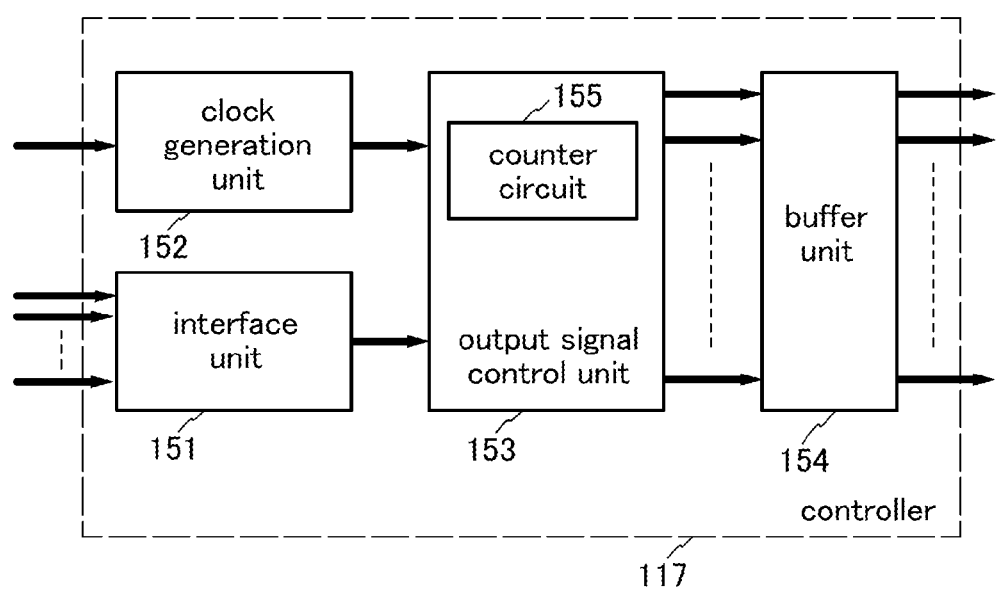
FIG. 3 shows a controller of a semiconductor device.

FIG. 3 shows a configuration example of the controller 117. The controller 117 includes an interface unit 151, a clock generation unit 152, an output signal control unit 153, and a buffer unit 154.

The temperature data calculated by the temperature detection circuit 113 and the temperature detection circuit 115 and other input signals such as an instruction signal and input signal are input to the output signal control unit 153 through the interface unit 151.

The clock generation unit 152 generates a clock signal used in the controller 117 by using an inputted clock signal, and outputs the generated clock signal to the circuits (the output signal control unit 153 included). Here, dividing the frequency of the inputted clock signal to be used in the controller 117 can reduce power consumption of the controller 117.

The output signal control unit 153 includes a counter circuit 155. The output signal control unit 153 has a function of counting clock signals by the counter circuit 155 and setting the state (high/low) of a plurality of output signals in accordance with a signal (e.g., the temperature data calculated by the temperature detection circuit 113 and the temperature detection circuit 115) input to the controller 117. Examples of the plurality of signals include a control signal for controlling the power supply control switch 101 and the power supply control switch 103 independently (e.g., control signal SW_ON or control signal SW_OFF).

The control signal generated in the output signal control unit 153 is output to the power supply control switch 101 or the power supply control switch 103 through the buffer unit 154.

Although the processor 100 in FIG. 1 includes one arithmetic circuit and one cache memory as the arithmetic circuit 105 and the cache memory 107, the structure is not limited thereto. Two or more arithmetic circuits 105 and two or more cache memories 107 may be provided. Moreover, a circuit block having another function may be additionally provided. In that case, the number of power supply control switches, the number of memory circuits, and the number of temperature detection circuits are determined in accordance with the number of the provided arithmetic circuits 105, the number of the provided cache memories 107, and the number of the provided circuit blocks.

Figure 4A:
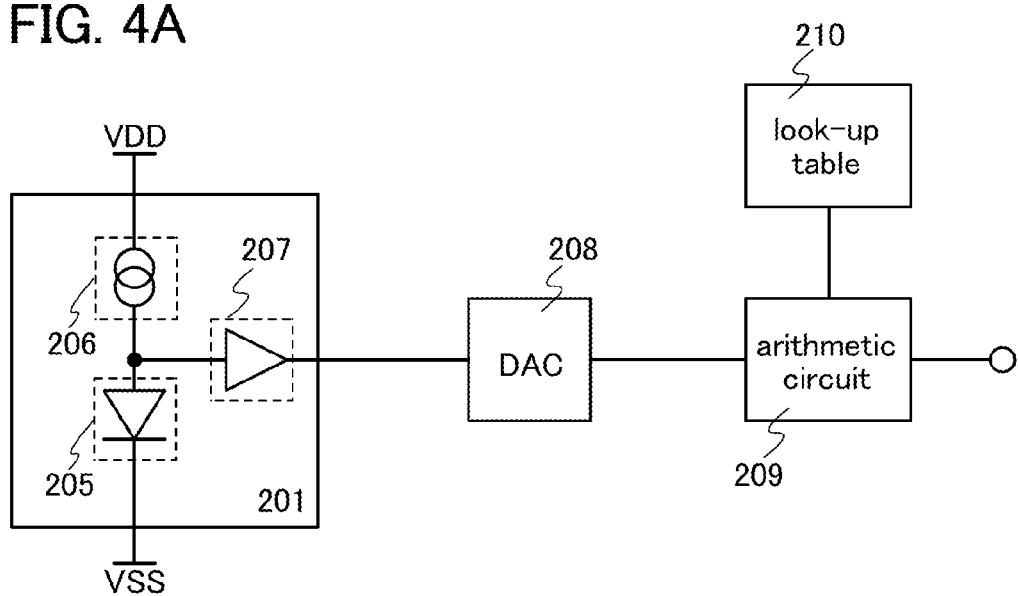
FIGS. 4A and 4B each show a temperature sensor of a semiconductor device.
Figure 4B:
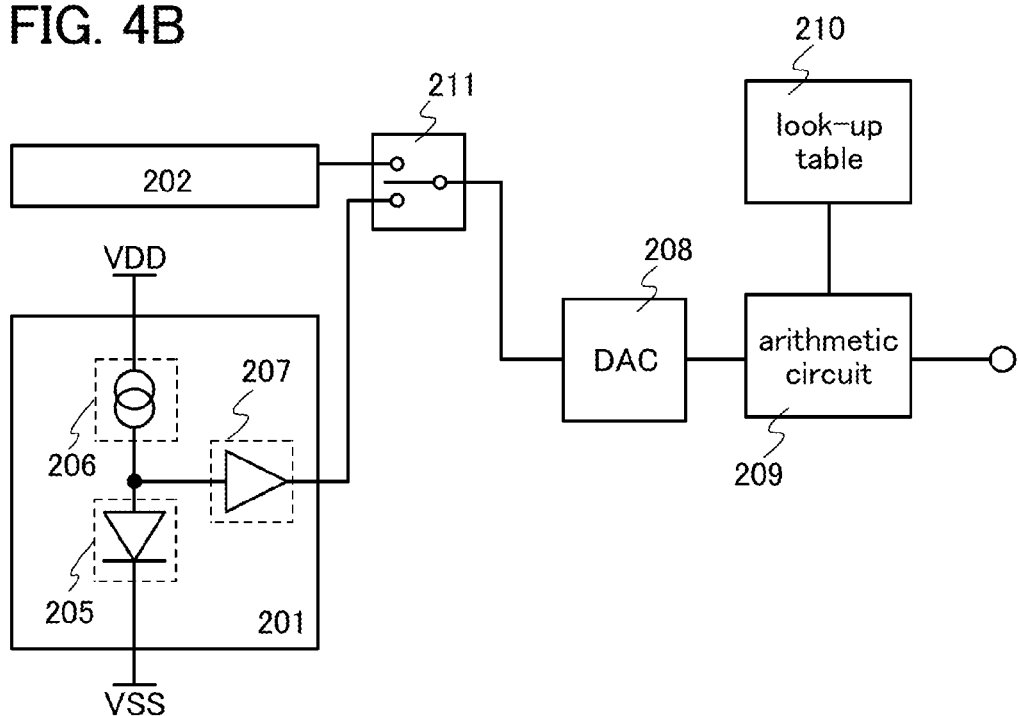

Here, the temperature sensor and the peripheral circuit included in the temperature detection circuit 113 and the temperature detection circuit 115 are described. FIGS. 4A and 4B are block diagrams showing configuration examples of the temperature sensor and the peripheral circuit.

As shown in FIG. 4A, a temperature sensor 201 includes a temperature detection diode 205, a constant current source 206, and a buffer amplifier 207. As the peripheral circuit, the following components are provided: a digital to analog converter (DAC) 208 which converts an analog signal (the temperature data of the memory circuit 109 or the memory circuit 111) outputted from the temperature sensor 201 into a digital signal; a look-up table 210 which stores reference data for detecting the temperatures of the memory circuit 109 and the memory circuit 111 and data of overhead estimated from the detected temperature; and an arithmetic circuit 209 which performs comparison and operation of the data and the converted digital signal. Although not illustrated in FIG. 4A, a control circuit which controls the DAC 208, the arithmetic circuit 209, and the look-up table 210 may be provided as the peripheral circuit. The temperature sensor 201 may be a digital output temperature sensor including the DAC 208 in addition to the temperature detection diode 205, the constant current source 206, and the buffer amplifier 207.

The temperature sensor 201, the DAC 208, the arithmetic circuit 209, and the look-up table 210 shown in FIG. 4A are defined as one unit. In the processor 100, each of the temperature detection circuit 113 and the temperature detection circuit 115 includes the unit.

Further, as shown in FIG. 4B, the temperature sensor and the peripheral circuit included in the temperature detection circuit 113 and the temperature detection circuit 115 may include the following components: the temperature sensor 201 for detecting the temperature of the memory circuit 109; a temperature sensor 202 for detecting the temperature of the memory circuit 111, which has a structure similar to that of the temperature sensor 201; a switch 211; the DAC 208; the arithmetic circuit 209; and the look-up table 210. With such a circuit configuration, the temperature sensor 201 and the temperature sensor 202 can be made to operate by switching the switch 211, unlike the case of FIG. 4A. In other words, by switching the switch 211, the temperatures of the memory circuit 109 and the memory circuit 111 can be detected. Note that although not illustrated in FIG. 4B, as the peripheral circuit, a control circuit which controls the switch 211, the DAC 208, the arithmetic circuit 209, and the look-up table 210 may be provided. Further, the number of temperature sensors provided in the temperature detection circuit is preferably equal to the number of the arithmetic circuits and cache memories to be provided, and operation of the provided temperature sensors is preferably switched by the switch.

Figure 5:
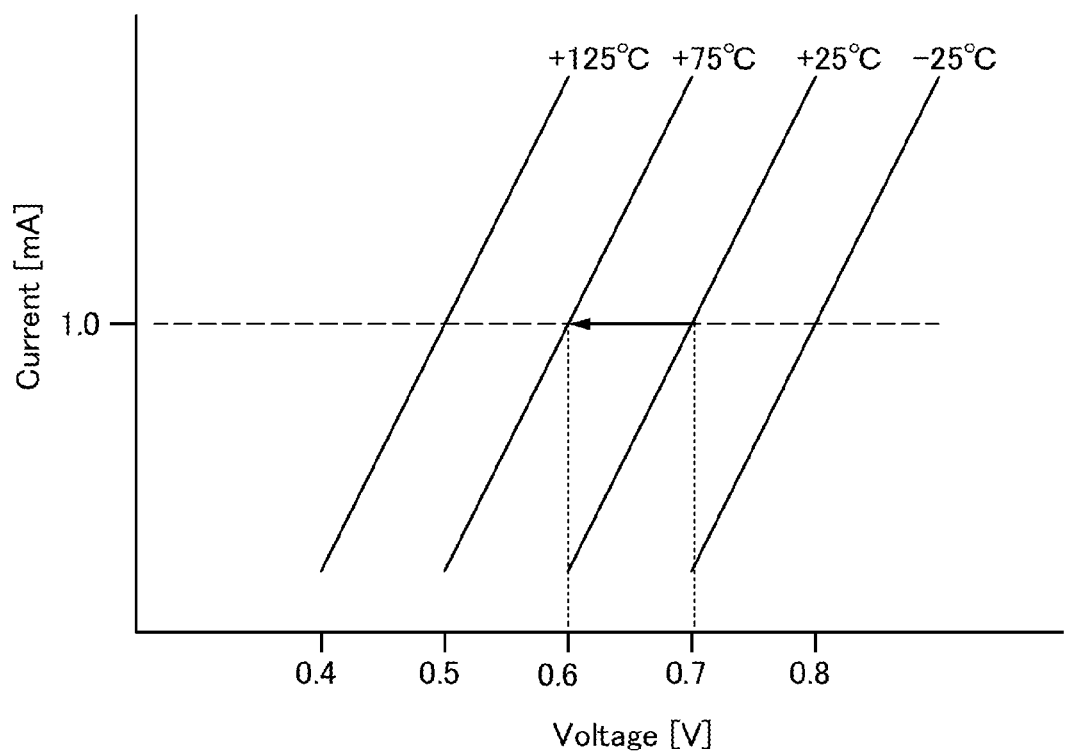
FIG. 5 shows temperature characteristics of a diode included in a temperature sensor.

As the temperature detection diode 205 included in the temperature sensor 201, a semiconductor diode whose forward voltage varies depending on the temperature can be used. For example, for the temperature detection diode 205, a diode having such temperature characteristics that the forward voltage of the diode is changed by −2 mV/° C. is used. FIG. 5 shows the temperature characteristics of the diode. In FIG. 5, the horizontal axis indicates the forward voltage [V], and the vertical axis indicates the forward current [mA] on a logarithmic scale.

In the case where the unit shown in FIG. 4A is used, the temperature detection circuit 113 detects the temperature of the memory circuit 109 in the following manner: the voltage of the temperature detection diode 205 corresponding to the set current of the constant current source 206 is sampled at regular intervals (e.g., once a second); the voltage is amplified by the buffer amplifier 207; the amplified voltage is converted into a digital signal by the DAC 208; and the signal is compared with the data stored in the look-up table 210 under operation by the arithmetic circuit 209. In addition, the temperature detection circuit 113 calculates overhead of the memory circuit 109 estimated from the detected temperature.

For example, in the temperature detection circuit 113 under the condition where the set current flowing in the temperature detection diode 205 is 1.0 mA, a voltage of 0.7 V output from the temperature sensor 201 at 25° C. is changed to 0.6 V after a certain period of time. In this case, the temperature of the temperature detection diode 205 after a certain period of time is increased by 50° C. from 25° C. to be 75° C. (see FIG. 5), which can be found out by applying the temperature characteristics of the temperature detection diode 205, which is −2 mV/° C. With use of these characteristics, the temperature of the memory circuit 109 can be detected.

Further, in the case where the circuit configuration shown in FIG. 4B is employed, for example, on and off the switch 211 is switched in accordance with the sampling interval between the memory circuit 109 and the memory circuit 111, whereby the temperature of the memory circuit 109 or the memory circuit 111 can be detected selectively. With the circuit configuration shown in FIG. 4B, the size of the processor can be reduced. Note that the temperature detection circuit 113 and the temperature detection circuit 115 can be incorporated in a processor chip.

As described above, data obtained by the temperature sensor 201 and the DAC 208 (the data is the temperatures of the memory circuit 109 and/or the memory circuit 111) and the data stored in the look-up table 210 are compared, whereby overhead of the memory circuit 109 and/or the memory circuit 111 can be estimated.

Next, a semiconductor memory device with nonvolatility included in the memory circuit 109 and the memory circuit 111 is described with reference to drawings. In particular, a semiconductor memory device in which a transistor with extremely low off-state current is used in a volatile memory is described.

Figure 6:
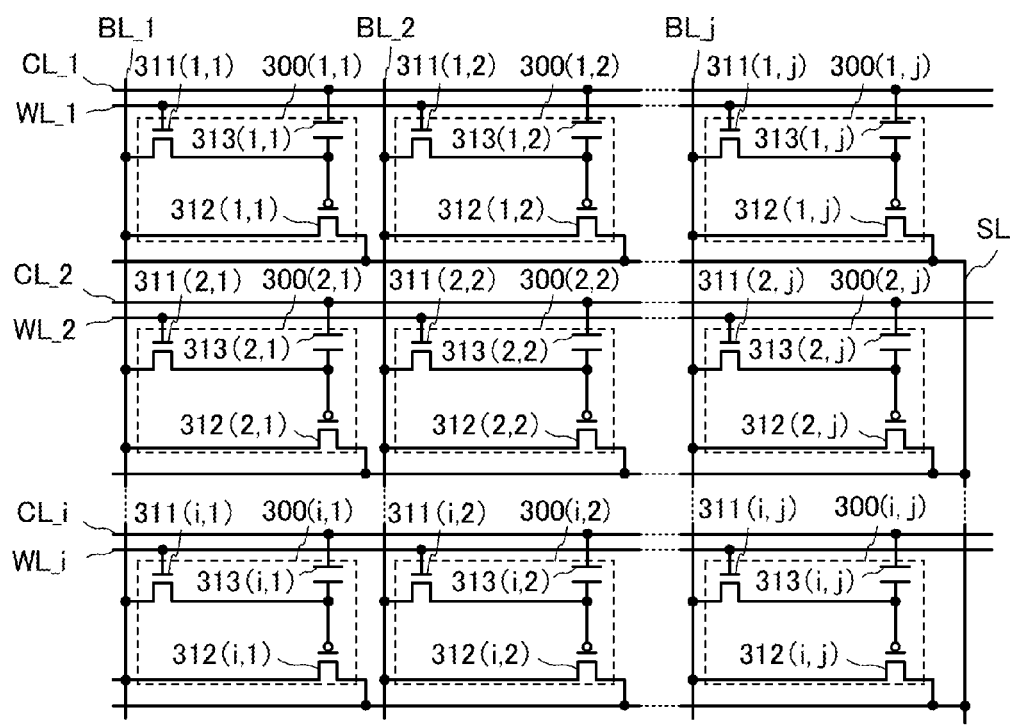
FIG. 6 shows a semiconductor memory device included in a memory circuit of a semiconductor device.
Figure 7:
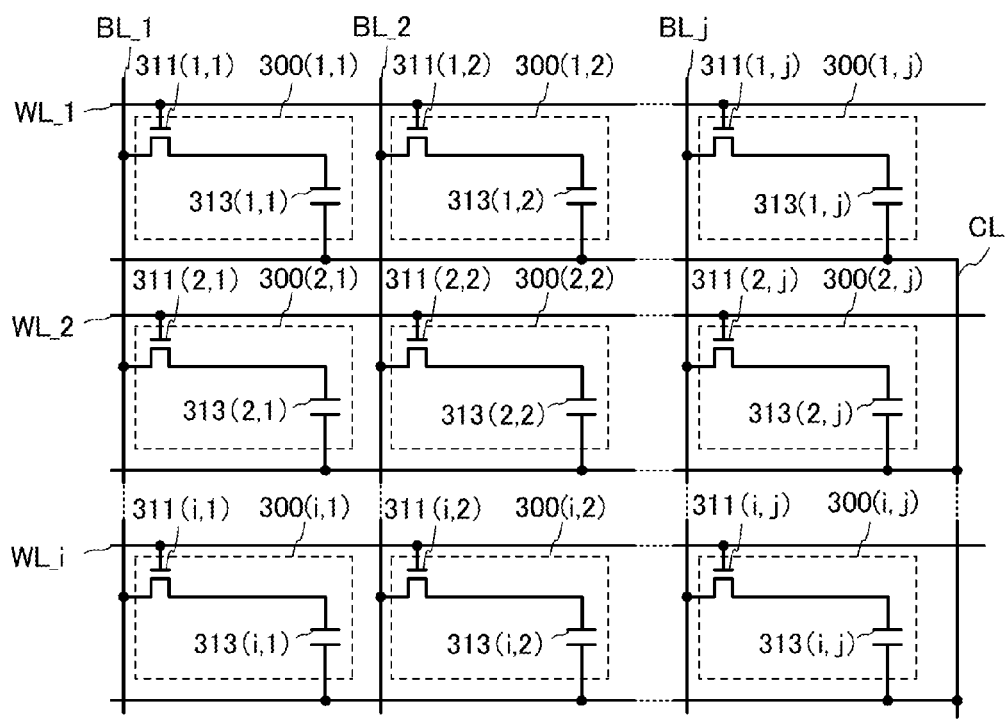
FIG. 7 shows a semiconductor memory device included in a memory circuit of a semiconductor device.

Each of the memory circuit 109 and the memory circuit 111 includes a memory cell array including a plurality of memory cells arranged in matrix of i rows (i is a natural number of 2 or more) and j columns (j is a natural number) (see FIG. 6 and FIG. 7). Note that each of the memory circuit 109 and the memory circuit 111 includes one or both of the memory cell arrays illustrated in FIG. 6 and FIG. 7.

An example of the memory cell array illustrated in FIG. 6 is described.

The memory cell array illustrated in FIG. 6 includes a plurality of memory cells 300 arranged in matrix of i rows and j columns, first to j-th bit lines BL, first to i-th word lines WL, first to i-th capacitor lines CL, and a source line SL to which a predetermined potential is applied.

In the memory cell array illustrated in FIG. 6, the memory cell 300 of the M-th row (M is a natural number of 1 to i) and the N-th column (N is a natural number of 1 to j), that is, the memory cell 300(M, N) includes a transistor 311(M, N), a transistor 312(M, N), and a capacitor 313(M, N).

One of a source and a drain of the transistor 311(M, N) is electrically connected to the bit line BL_N. A gate of the transistor 311(M, N) is electrically connected to the word line WL_M.

The transistor 311(M, N) is an n-channel transistor and controls writing and holding of data.

Further, the transistor 311(M, N) can be a transistor with a low off-state current. For example, a transistor including an oxide semiconductor can be used. With use of such a transistor, a data holding period can be made longer, and even when supply of the power supply voltage is stopped, data can be held. In other words, a volatile memory including the memory cell array illustrated in FIG. 6 can function as a nonvolatile memory. Thus, for the memory circuit 109 and the memory circuit 111, the volatile memory including the memory cell array illustrated in FIG. 6 can be used.

The transistor 312(M, N) is a p-channel transistor. One of a source and a drain of the transistor 312(M, N) is electrically connected to the bit line BL_N. The other of the source and the drain of the transistor 312(M, N) is electrically connected to the source line SL. Further, a gate of the transistor 312(M, N) is electrically connected to the other of the source and the drain of the transistor 311(M, N).

The transistor 312(M, N) serves as an output transistor which sets a potential of data to be output.

One of a pair of electrodes of the capacitor 313(M, N) is electrically connected to the other of the source and the drain of the transistor 311(M, N), and the other thereof is electrically connected to the capacitor line CL_M.

The capacitor 313(M, N) functions as a storage capacitor that holds data.

The above is the description of the configuration example of the memory cell array illustrated in FIG. 6.

Note that the transistor 312 is not necessarily provided in the memory cell. For example, the memory cell may have a configuration illustrated in FIG. 7. In this case, the capacitor lines CL can be integrated into one line which also serves as a source line SL.

Also in the memory cell array illustrated in FIG. 7, the transistor 311(M, N) can be a transistor with a low off-state current. For example, a transistor including an oxide semiconductor can be used. With use of such a transistor, a data holding period can be made longer, and even when supply of the power supply voltage is stopped, data can be held. In other words, the semiconductor memory device including the memory cell array illustrated in FIG. 7 can function as a nonvolatile memory. Thus, for the memory circuit 109 and the memory circuit 111, the semiconductor memory device including the memory cell array illustrated in FIG. 7 can be used.

Figure 8A:
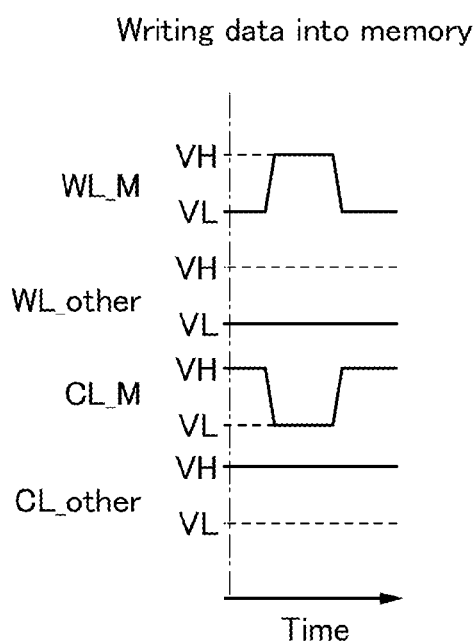
FIGS. 8A and 8B show operation of a semiconductor memory device included in a memory circuit of a semiconductor device.
Figure 8B:
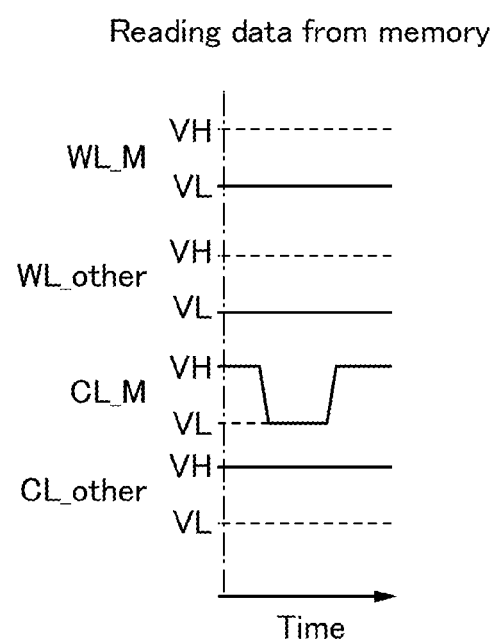

Next, an example of a method for driving a semiconductor memory device including the memory cell array illustrated in FIG. 6 will be described with reference to FIGS. 8A and 8B. FIGS. 8A and 8B are timing charts showing an example of driving the semiconductor memory device illustrated in FIG. 6. Here, the case where data is sequentially written into the memory cells 300 of the M-th row and then the written data is read is described as an example; however, one embodiment is not limited to this case.

First, in order to write data into the memory cells 300 of the M-th row (referred to as "Writing into memory"), the potential of the M-th word line WL_M is set at VH and the potentials of the other word lines WL_other are set at VL as illustrated in FIG. 8A.

Note that VH is a potential higher than a reference potential (e.g., the ground potential) and, for example, is a high power supply potential. Moreover, VL is a potential lower than or equal to the reference potential and, for example, is a low power supply potential.

At this time, in each of the memory cells 300 of the M-th row, the transistor 311 is turned on and the potential of one of the pair of electrodes of the capacitor 313 becomes equal to the potential of the corresponding bit line BL.

Then, the transistor 311 is turned off and the gate of the transistor 312 becomes floating, so that the potential of the gate of the transistor 312 is held.

Data can be written into all the memory cells 300 by performing the above operation row by row.

In order to read data from the memory cells 300 of the M-th row (referred to "Reading from memory"), the potentials of all the word lines WL are set at VL, the potential of the M-th capacitor line CL_M is set at VL, and the potentials of the other capacitor lines CL_other are set at VH as illustrated in FIG. 8B.

In each of the memory cells 300 of the M-th row, the resistance value between the source and the drain of the transistor 312 depends on the gate voltage of the transistor 312. In addition, a potential corresponding to the amount of current flowing between the source and the drain of the transistor 312 can be read from the memory cell 300 as data.

Data can be read from all the memory cells 300 by repeatedly performing the above operation row by row. The above is description of an example of a method for driving the semiconductor memory device illustrated in FIG. 6.

As described with reference to FIG. 6, FIG. 7, and FIGS. 8A and 8B, in the semiconductor memory device included in the memory circuit 109 and the memory circuit 111, with use of a transistor with extremely low off-state current as the transistor which controls writing and holding of data (the transistor 311(M, N)), a data holding period can be made longer, and even when supply of the power supply voltage is stopped, data can be held. Thus, when the transistor with extremely low off-state current is used for a transistor which controls writing and holding of data in the memory circuit 109 and the memory circuit 111, power gating can be carried out, and a processor with low power consumption can be manufactured.

Figure 9:
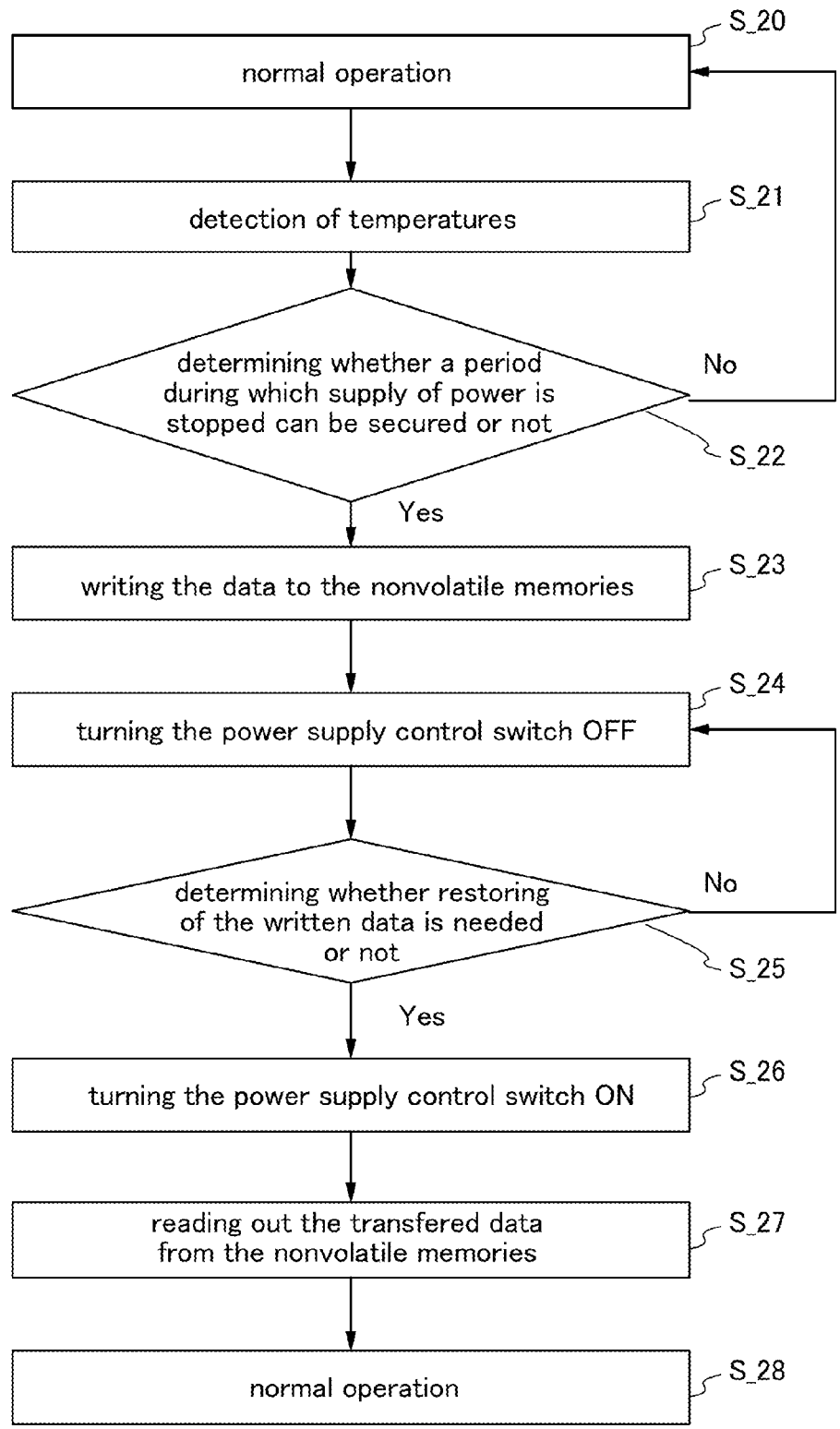
FIG. 9 shows operation of a semiconductor device.
Figure 10A:
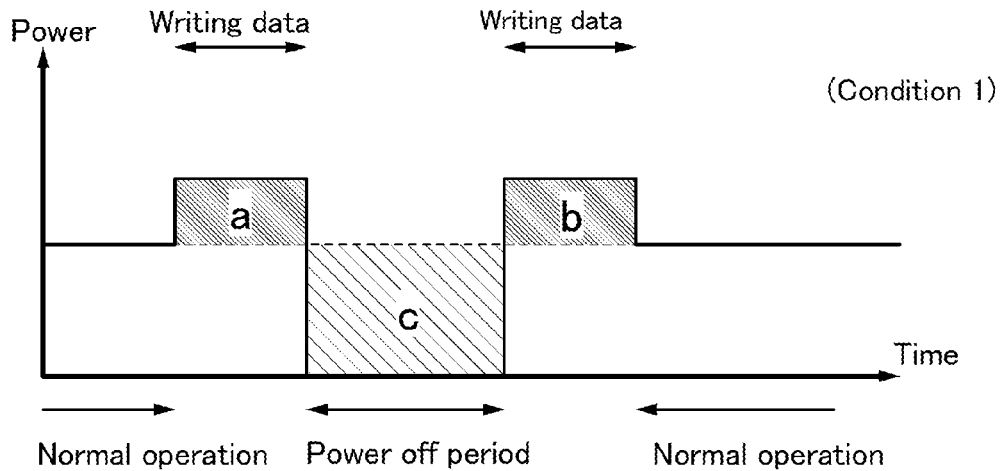
FIGS. 10A to 10C each show a relation between overhead and a power-off period.
Figure 10B:
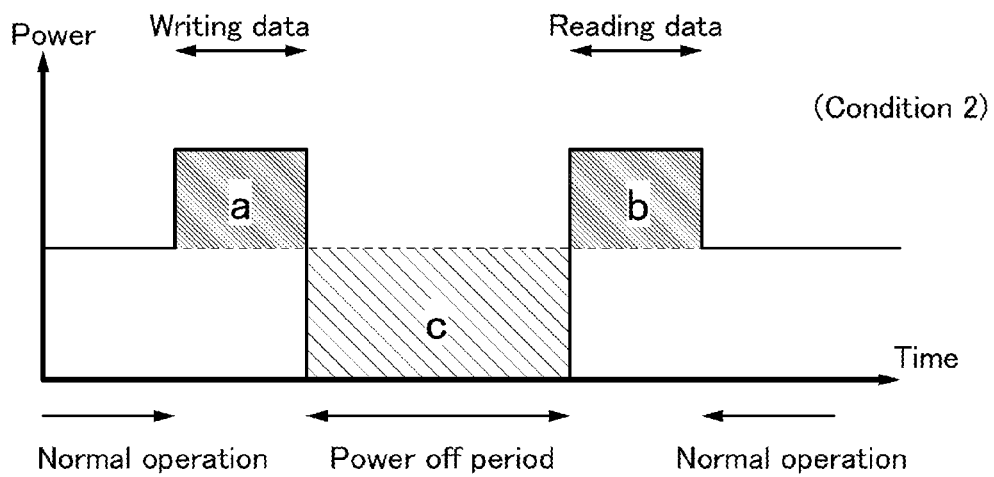
Figure 10C:
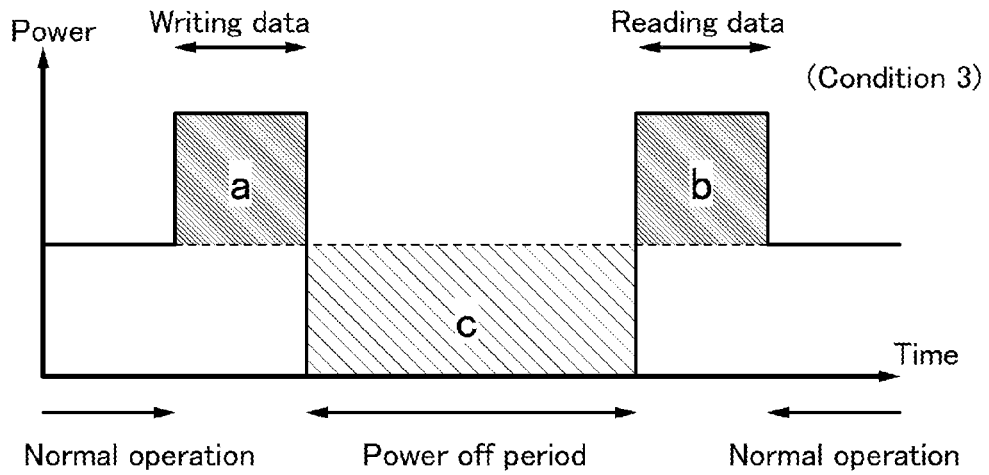

Next, operation of the processor 100 is described with reference to drawings. FIG. 9 is a flow chart showing operation of the processor 100. FIGS. 10A to 10C each show a relation between overhead and a power-off period in the processor 100. Note that in each of FIGS. 10A to 10C, the horizontal axis indicates time, and the vertical axis indicates power consumption. In ascending order of temperatures of the memory circuit 109 and the memory circuit 111, Condition 1 is followed by Condition 2 and Condition 3. As for operation speeds of the memory circuit 109 and the memory circuit 111, Condition 3 has the lowest speeds, which is followed by Condition 2 and Condition 1.

The processor 100 (in particular, the arithmetic circuit 105 and the cache memory 107) operates at a constant speed. This operation is referred to as normal operation (step S_20) for convenience. Note that in the processor 100 under normal operation, the power supply voltage is supplied to the arithmetic circuit 105 and the cache memory 107.

In the processor 100 under normal operation, the temperature detection circuit 113 detects the temperature of the memory circuit 109, and the temperature detection circuit 115 detects the temperature of the memory circuit 111 (step S_21). Detection of the temperatures enables overhead at the time of transferring data to the memory circuit 109 and the memory circuit 111 to be calculated (estimated). Specifically, overhead at the time when data obtained by the arithmetic circuit 105 and data stored in the cache memory 107 are written to nonvolatile memories included in the circuit 109 and the memory circuit 111 can be calculated.

Next, in the processor 100, in the case where supply of power is provided but processing (arithmetic processing and writing or reading to/from the cache memory) is not performed in the arithmetic circuit 105 and the cache memory 107, whether a period during which supply of power to the arithmetic circuit 105 and the cache memory 107 is stopped can be secured or not is determined (step S_22). This determination depends on the relation between the operation speeds of the arithmetic circuit 105 and the cache memory 107 and the temperature data of overhead or the like, which is estimated from the detected temperatures. For example, as in the case of Conditions 1 to 3, a power-off period can be secured, regardless of any temperature of the memory circuit 111, as long as overhead can be estimated and the relation $a+b<c$ can be satisfied in the operation (see FIGS. 10A, 10B, and 10C). In the case where the power-off periods with respect to the arithmetic circuit 105 and the cache memory 107 can be secured, the data obtained by the arithmetic circuit 105 and the data stored in the cache memory 107 are transferred to the memory circuit 109 and the memory circuit 111 before the power-off periods start. Specifically, the data is written to the nonvolatile memories included in the memory circuit 109 and the memory circuit 111 (step S_23). Note that in the case where the power-off periods with respect to the arithmetic circuit 105 and the cache memory 107 are not be secured, the normal operation continues (step S_20).

After the data is written to the nonvolatile memories, the power supply control switch provided between the arithmetic circuit 105 and the power supply and the power supply control switch provided between the cache memory 107 and the power supply are turned off, whereby supply of power to the arithmetic circuit 105 and the cache memory 107 is stopped (step S_24).

After the power gate is turned off, whether restoring of the written data is needed or not is determined (step S_25). This determination state lasts until the arithmetic circuit 105 and the cache memory 107 are made to operate again. In the case where the arithmetic circuit 105 and the cache memory 107 are not made to operate again and restoring of the data is not necessary, the power gate remains off. Thus, power is not supplied to the arithmetic circuit 105 and the cache memory 107 until the arithmetic circuit 105 and the cache memory 107 are made to operate again.

In the case where the restoring of the data is needed, e.g., the case where the arithmetic circuit 105 and the cache memory 107 operate again, before resuming the operation, the power gate is turned on, so that supply of power to the arithmetic circuit 105 and the cache memory 107 is restarted (step S_26).

Then, the transferred data is read out from the nonvolatile memories and restored in the arithmetic circuit and the cache memory (step S_27), and the normal operation is carried out again (step S_28).

In FIGS. 10A to 10C, regions represented as "a" and "b" mean overhead at the time of writing or reading data to/from the nonvolatile memories included in the memory circuit 109 and the memory circuit 111. Further, a region represented as "c" means power which can be reduced by power gating. The amount of overhead is increased as the temperatures of the memory circuit 109 and the memory circuit 111 are increased. In other words, the amount of overhead under Condition 1 is smallest, which is followed by those of Condition 2 and Condition 3 in this order.

Figure 16A:
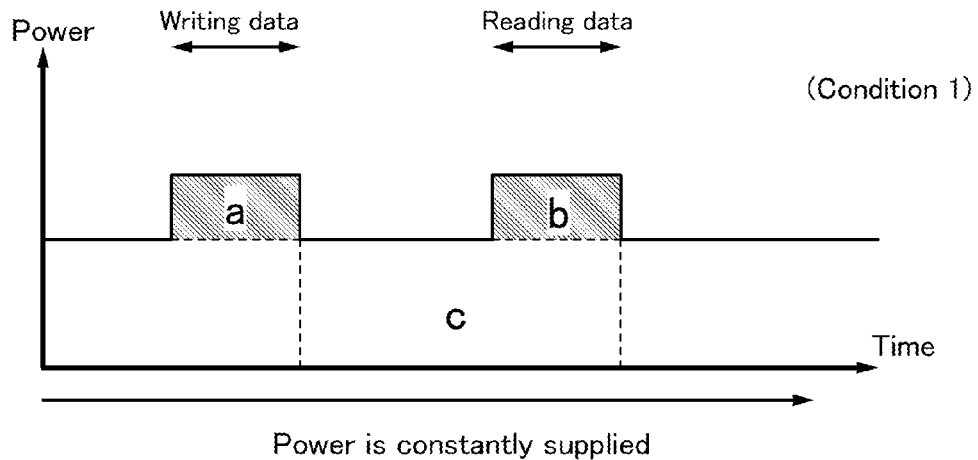
FIGS. 16A to 16C each show a period during which supply of power is stopped by the power gating described with FIG. 15.
Figure 16B:
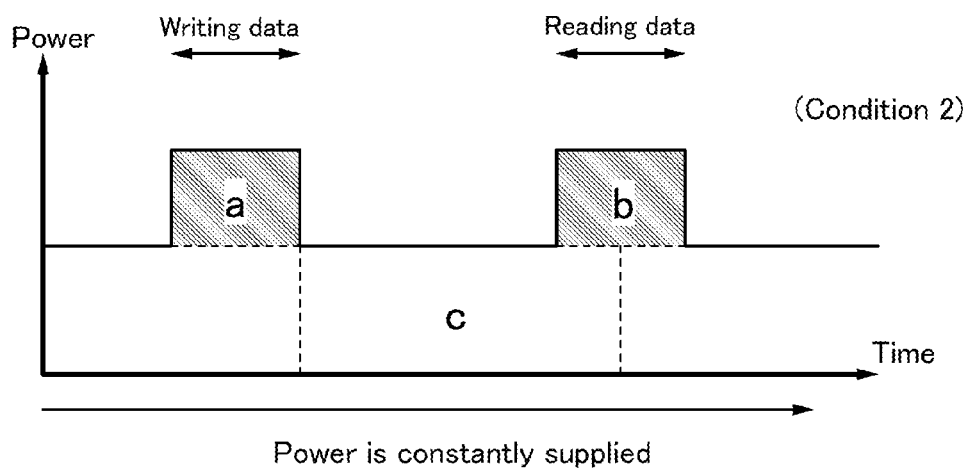
Figure 16C:
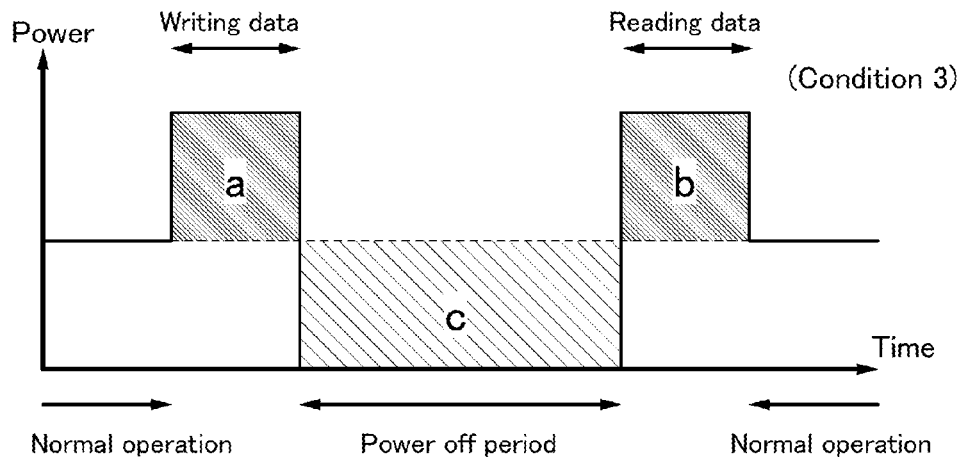

If the power gating is conducted in accordance with the flow chart shown in FIG. 15, a power-off period is determined on the basis of the amount of overhead of Condition 3 which has the highest temperatures of the memory circuit 109 and the memory circuit 111, and a power-off period cannot be set except the above determined period. Thus, Under Condition 1 and Condition 2, supply of power cannot be stopped (see FIGS. 16A to 16C).

On the other hand, in the processor 100, the temperature data of the memory circuit 109 and the memory circuit 111 can be calculated by the temperature detection circuit 113 and the temperature detection circuit 115; overhead at the time when data obtained by the arithmetic circuit 105 and data stored in the cache memory 107 are held in the memory circuit 109 and the memory circuit 111 (specifically, overhead at the time of writing or reading data to/from the nonvolatile memories) can be estimated. Therefore, even under Condition 1 or Condition 2 where the supply of power cannot be stopped by the power gating conducted in accordance with the flow chart shown in FIG. 15, a period during which power supply is stopped (power-off period) is set, and supply of the power supply voltage to the arithmetic circuit 105 and the cache memory 107 can be stopped (FIGS. 10A and 10B).

In order words, by calculation of the temperature data of the memory circuit 109 and the memory circuit 111, the power-off periods with respect to the arithmetic circuit 105 and the cache memory 107 can be set, regardless of the operation speed of the processor 100. For example, in the power gating conducted in accordance with the flow chart shown in FIG. 9, a power-off period can be set even under high speed operation where it is difficult to provide a power-off period, and thus, power consumption can be reduced. As described above, the processor 100 can achieve low power consumption.

According to one embodiment of the present invention, the temperature of the memory circuit is detected, whereby a period during which supply of power to the circuit block is stopped can be optimally set in accordance with temperature dependency of overhead of the memory circuit, regardless of the operation speed. Therefore, in the semiconductor device which is one embodiment of the present invention, a period during which supply of power to the circuit block is stopped can be set, regardless of the operation speed; accordingly, power consumption can be favorably reduced.

The structures, methods, and the like described in this embodiment can be combined with any of the other embodiments, as appropriate.

Embodiment 2

In this embodiment, structure examples of transistors applicable to a semiconductor device which is one embodiment of the present invention will be described with reference to schematic cross-sectional views in FIGS. 11A to 11C. Note that components illustrated in FIGS. 11A to 11C are not to scale in some cases.

Figure 11A:
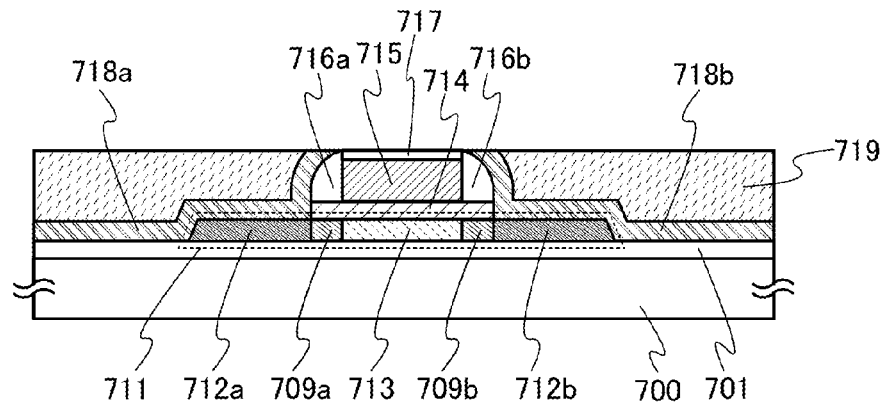
FIGS. 11A to 11C each illustrate a structure of a transistor included in a semiconductor device.
Figure 11B:
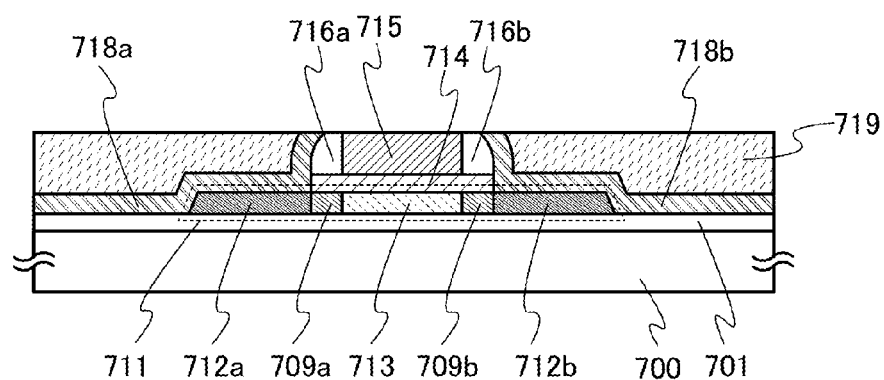
Figure 11C:
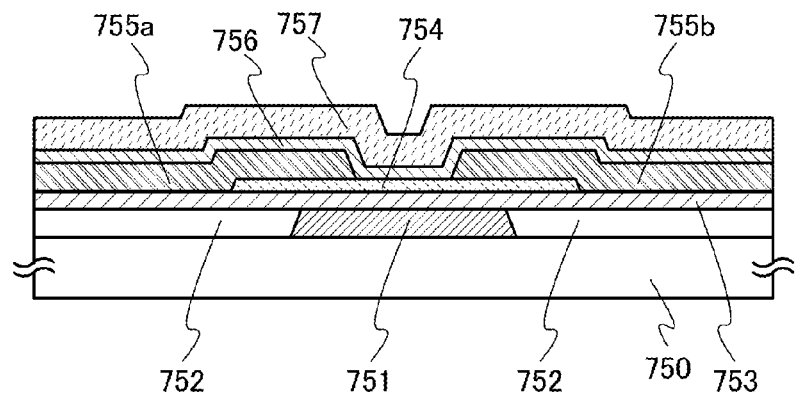

The transistor illustrated in FIG. 11A includes a semiconductor layer 711, an insulating layer 714, a conductive layer 715, insulating layers 716a and 716b, an insulating layer 717, conductive layers 718a and 718b, and an insulating layer 719.

The semiconductor layer 711 is positioned over an element formation layer 700 with the insulating layer 701 interposed therebetween. Note that the semiconductor layer 711 is not necessarily provided over the insulating layer 701 and may be provided directly on the element formation layer 700.

The semiconductor layer 711 includes regions 709a and 709b which are separated from each other and to which dopant is added, and regions 712a and 712b which are separated from each other and to which the dopant is added. Between the regions 709a and 709b, a channel formation region 713 is provided. The regions 712a and 712b to which the dopant is added has higher dopant concentration and lower resistivity than the regions 709a and 709b to which the dopant is added. The regions 712a and 712b function as a source region and a drain region. As in the semiconductor layer 711, the resistivity is gradually changed, whereby the electric-field concentration in the vicinity of the drain region can be reduced. Thus, a fluctuation in the threshold voltage, a breakdown of the transistor, and the like can be suppressed.

The insulating layer 714 is positioned over part of the semiconductor layer 711.

The conductive layer 715 overlaps with the semiconductor layer 711 with the insulating layer 714 interposed therebetween.

The insulating layer 716a is provided in contact with one of a pair of side surfaces of the conductive layer 715. The insulating layer 716b is provided in contact with the other thereof.

The insulating layer 717 is positioned over the conductive layer 715. Note that the insulating layer 717 is not necessarily provided as shown in FIG. 11B.

The conductive layers 718a and 718b are in contact with the regions 712a and 712b, respectively. Further, the conductive layers 718a and 718b are in contact with a side surface of the insulating layer 716a and that of the insulating layer 716b, respectively.

The insulating layer 719 is positioned over the conductive layers 718a and 718b.

The conductive layers 718a and 718b and the insulating layer 719 are formed in such a manner that a stack of a conductive film and an insulating layer is subjected to a planarization treatment (e.g., CMP treatment or etchback treatment), for example. Note that providing the insulating layer 717 as in the transistor in FIG. 11A can prevent short circuit between the conductive layer 715 and the conductive layers 718a and 718b because they are not in contact with each other after the planarization treatment.

The transistor in FIG. 11C includes a conductive layer 751, an insulating layer 752, an insulating layer 753, a semiconductor layer 754, conductive layers 755a and 755b, an insulating layer 756, and an insulating layer 757.

The conductive layer 751 is positioned over an element formation layer 750.

The insulating layer 752 is provided over the element formation layer 750. Surfaces of the insulating layer 752 and the conductive layer 751 are preferably flat.

The conductive layer 751 and the insulating layer 752 are formed, for example, by planarization treatment (e.g., CMP treatment or etchback treatment) performed on a stack of a conductive film and an insulating layer.

The insulating layer 753 is positioned over the conductive layer 751 and the insulating layer 752.

The semiconductor layer 754 overlaps with the conductive layer 751 with the insulating layer 753 interposed therebetween.

The conductive layers 755a and 755b are separated from each other and electrically connected to the semiconductor layer 754. Here, the distance between the conductive layers 755a and 755b corresponds to the channel length of the transistor and is preferably shorter than 50 nm, for example. The distance between the conductive layers 755a and 755b can be made shorter than 50 nm in such a manner that part of a conductive film is etched using a resist mask formed by electron beam exposure. Further, in the case where the distance between the conductive layers 755a and 755b is made shorter than 50 nm without an electron beam, a resist mask is formed by ultraviolet light exposure, the resist mask is subjected to slimming treatment, and then part of the conductive film is etched with use of the mask.

Although not shown, a pair of conductive layers may be provided between the insulating layer 756 and the conductive layers 755a and 755b. The distance between such a pair of conductive layers is preferably larger than that of the conductive layers 755a and 755b. The electric resistance of the pair of conductive layers is preferably lower than that of the conductive layers 755a and 755b. With such a structure, the amount of on-state current of the transistor in FIG. 11C can be increased.

The insulating layer 757 is positioned over the semiconductor layer 754 to cover an upper surface of the semiconductor layer 754.

Next, components will be described below. Each of the components is not limited to a single layer and may be a stack of layers.

The insulating layer 701 is a base layer. The insulating layer 701 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The insulating layer 752 can be a layer containing a material similar to that of the insulating layer 701.

Each of the semiconductor layers 711 and 754 functions as a layer in which a channel of the transistor is formed (also referred to as channel formation layer).

As each of the semiconductor layers 711 and 754, a semiconductor layer including an oxide semiconductor (also referred to as oxide semiconductor layer) can be used, for example.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

As an oxide semiconductor that can be applied to the oxide semiconductor layer, metal oxide containing zinc and one or both of indium and gallium, metal oxide containing another metal element instead of part or all of gallium in the given metal oxide, or the like can be given.

For example, In-based metal oxide, Zn-based metal oxide, In—Zn-based metal oxide, In—Ga—Zn-based metal oxide, or the like can be used as the metal oxide. Alternatively, metal oxide including another metal element instead of part or all of Ga (gallium) in the In—Ga—Zn-based metal oxide may be used.

As the aforementioned another metal element, a metal element that is capable of combining with more oxygen atoms than gallium can be used. For example, one or more elements of titanium, zirconium, hafnium, germanium, and tin can be used. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the additive amount of such a metal element is determined so that the metal oxide can function as a semiconductor. When a metal element that is capable of combining with more oxygen atoms than gallium is used and oxygen is supplied to a metal oxide, oxygen defects in the metal oxide can be reduced.

For example, when tin is used instead of all Ga (gallium) contained in the In—Ga—Zn-based metal oxide, In—Sn—Zn-based metal oxide is obtained. When titanium is used instead of part of Ga (gallium) contained in the In—Ga—Zn-based metal oxide, In—Ti—Ga—Zn-based metal oxide is obtained.

In the case where an oxide semiconductor layer is used as the semiconductor layers 711 and 754, the oxide semiconductor layer can be highly purified, for example, in the following manner: dehydration or dehydrogenation is performed so that impurities such as hydrogen, water, a hydroxyl group, and a hydride (also referred to as hydrogen compound) are removed from the oxide semiconductor layer, and oxygen is supplied to the oxide semiconductor layer. For example, a layer containing oxygen is used as the layer in contact with the oxide semiconductor layer, and heat treatment is performed; thus, the oxide semiconductor layer can be highly purified.

Specifically, in each of the processes of manufacturing the transistors in FIGS. 11A and 11B, heat treatment is preferably performed as appropriate at least after the step of forming the semiconductor layer 711. The temperature of the heat treatment is higher than or equal to 300° C. and lower than or equal to 700° C., or lower than the strain point of the substrate. The heat treatment can be performed under reduced pressure, a nitrogen atmosphere, an oxygen atmosphere, a rare gas atmosphere, or the like. Note that the heat treatment may be performed more than once.

In the process of manufacturing the transistor in FIG. 11C, heat treatment is preferably performed at least after the semiconductor layer 754 is formed or after the insulating layer 757 is formed; alternatively, heat treatment is performed plural times, i.e., after the semiconductor layer 754 is formed and after the insulating layer 757 is formed. The temperature of the heat treatment is higher than or equal to 300° C. and lower than or equal to 700° C., or lower than the strain point of the substrate. The heat treatment can be performed under reduced pressure, a nitrogen atmosphere, an oxygen atmosphere, a rare gas atmosphere, or the like.

In addition, the oxide semiconductor layer that has just been formed is preferably supersaturated with oxygen so that the proportion of oxygen is higher than that in the stoichiometric composition. For example, in the case of using sputtering, the oxide semiconductor layer is preferably formed under the condition where the proportion of oxygen in a deposition gas is high, and particularly in an oxygen atmosphere (e.g., oxygen gas: 100%).

The oxide semiconductor film may be formed by a sputtering method at the substrate temperature of higher than or equal to 100° C. and lower than or equal to 500° C., preferably higher than or equal to 200° C. and lower than or equal to 350° C. In such a manner, a CAAC-OS layer can be easily formed.

Further, in order to sufficiently supply oxygen to supersaturate the oxide semiconductor layer with oxygen, an insulating layer (e.g., the insulating layers 701, 714, 753, and 757) which contains excess oxygen may be provided as the insulating layer in contact with the oxide semiconductor layer.

For example, the insulating layer containing excess oxygen can be formed as follows: the insulating layer is deposited using a sputtering method under the deposition conditions such that a large amount of oxygen is contained in the film. In order to make the insulating layer contain much more excess oxygen, oxygen may be added by an ion implantation method, an ion doping method, or plasma treatment. Moreover, oxygen may be added to the oxide semiconductor layer.

In a sputtering apparatus, the amount of moisture remaining in a deposition chamber is preferably small. Therefore, an entrapment vacuum pump is preferably used in the sputtering apparatus. Further, a cold trap may be used.

There is no particular limitation on a heat treatment apparatus to be used for the heat treatment, and a rapid thermal annealing (RTA) apparatus such as a gas rapid thermal annealing (GRTA) apparatus or a lamp rapid thermal annealing (LRTA) apparatus may be used. Alternatively, another heat treatment apparatus such as an electric furnace may be used.

After the heat treatment, a high-purity oxygen gas, a high-purity $N_2O$ gas, or ultra-dry air (having a dew point of −40° C. or lower, preferably −60° C. or lower) is preferably introduced in the furnace where the heat treatment has been performed while the heating temperature is being maintained or being decreased. In this case, it is preferable that the oxygen gas or the $N_2O$ gas do not contain water, hydrogen, or the like. The purity of the oxygen gas or the $N_2O$ gas which is introduced into the heat treatment apparatus is preferably 6N or higher, more preferably 7N or higher. That is, the impurity concentration of the oxygen gas or the $N_2O$ gas is preferably 1 ppm or lower, more preferably 0.1 ppm or lower. Through this step, oxygen is supplied to the oxide semiconductor layer, and defects due to oxygen vacancies in the oxide semiconductor layer can be reduced. Note that the introduction of a high-purity oxygen gas, a high-purity $N_2O$ gas, or ultra-dry air may be performed at the time of the above heat treatment.

The hydrogen concentration of the highly purified oxide semiconductor layer, measured by secondary ion mass spectrometry (also referred to as SIMS), is $5\times10^{19}$ atoms/cm$^3$ or lower, preferably $5\times10^{18}$ atoms/cm$^3$ or lower, more preferably $5\times10^{17}$ atoms/cm$^3$ or lower.

With use of the highly purified oxide semiconductor, the carrier density of the oxide semiconductor layer in a transistor can be lower than $1\times10^{14}$/cm$^3$, preferably lower than $1\times10^{12}$/cm$^3$, further preferably lower than $1\times10^{11}$/cm$^3$. Such a low carrier density can reduce the off-state current of the transistor per micrometer of channel width to $1\times10^{-19}$ A (100 zA) or less, preferably $1\times10^{-22}$ A (100 yA) or less. It is preferable that the off-state current of the transistor be as low as possible; the lowest value of the off-state current of the transistor is estimated to be about $1\times10^{-30}$ A/μm.

As the dopant contained in the regions 712a and 712b, it is possible to use an element of Group 13 in the periodic table (e.g., boron), an element of Group 15 in the periodic table (e.g., one or more of nitrogen, phosphorus, and arsenic), and/or a rare gas element (e.g., one or more of helium, argon, and xenon), for example. The dopant can be selected from at least one of these groups. After the conductive layer 715 is formed, the dopant is added with use of the conductive layer 715 as a mask, and at least the insulating layers 716a and 716b are formed. Then, the dopant is added again with use of the conductive layer 715 and the insulating layers 716a and 716b as a mask, so that the regions 709a and 709b, the regions 712a and 712b, and the channel formation region 713 can be formed in a self-aligned manner.

Each of the insulating layers 714 and 753 functions as a gate insulating layer of the transistor. As each of the insulating layers 714 and 753, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide can be used.

Each of the conductive layers 715 and 751 functions as a gate electrode of the transistor. As each of the conductive layers 715 and 751, for example, a layer containing a metal material such as molybdenum, titanium, chromium, tantalum, magnesium, silver, tungsten, aluminum, copper, neodymium, or scandium can be used. Note that each of the conductive layers 715 and 751 also functions as a gate wiring.

Each of the insulating layers 716a, 716b, and 717 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

Each of the conductive layers 718a and 718b and the conductive layers 755a and 755b functions as a source electrode or a drain electrode of the transistor. Each of the conductive layers 718a and 718b and the conductive layers 755a and 755b can be, for example, a layer containing a metal material such as molybdenum, titanium, chromium, tantalum, magnesium, silver, tungsten, aluminum, copper, neodymium, scandium, or ruthenium. Note that each of the conductive layers 718a and 718b and the conductive layers 755a and 755b also serves as a source wiring or a drain wiring.

The insulating layers 719 and 757 each function as a protective layer. Each of the insulating layers 719 and 757 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

In addition, Id-Vg characteristics of the transistor illustrated in FIG. 11B will be described as an example of electric characteristics of the transistor, with reference to FIG. 12. Note that in the transistor exhibiting the Id-Vg characteristics shown in FIG. 12, the semiconductor layer 711 is a 20-nm-thick In—Ga—Zn-based oxide semiconductor layer, the insulating layer 714 is a 20-nm-thick silicon oxynitride layer, the conductive layer 715 is a stack of a 30-nm-thick tantalum nitride layer and a 200-nm-thick tungsten layer, and each of the conductive layers 718a and 718b is a 30-nm-thick tungsten layer. In addition, phosphorus is added to form the regions 712a and 712b. The amount of added phosphorus is $1\times10^{15}$ cm$^{-2}$ and the acceleration voltage is 30 kV. Further, the channel length is 5 μm and the channel width is 10 μm. The horizontal axis indicates the gate voltage Vg and the vertical axis indicates the drain current Id or the field-effect mobility μFE.

Figure 12:
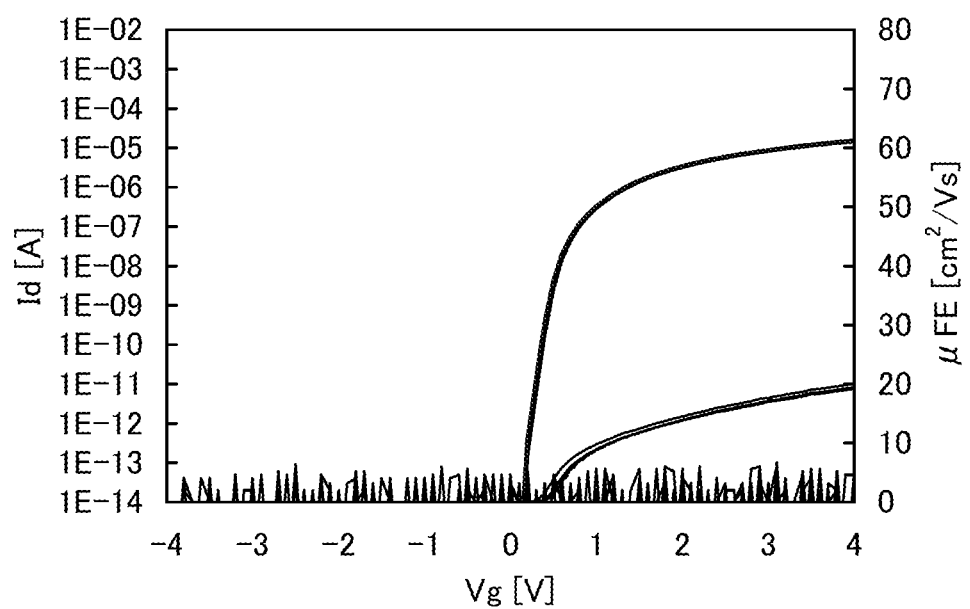
FIG. 12 shows electric characteristics of a transistor included in a semiconductor device.

In the transistor exhibiting the Id-Vg characteristics shown in FIG. 12, the field-effect mobility is about 20 cm$^2$/Vs, the off-state current is under the detection limit, and the threshold voltage is higher than or equal to 0 V.

Further, the value of the on-state resistance of the transistor exhibiting the Id-Vg characteristics shown in FIG. 12 is calculated with reference to following the formula (1).

$$Rd = \frac{Vd}{Id} = \frac{Vd}{\frac{W}{L}\mu Cox\{(Vg - Vth)Vd - \frac{1}{2}Vd^2\}}$$

When the relative permittivity of the insulating layer 714 is 4.1, the gate capacitance Cox is $1.82\times10^{-3}$ F/m$^2$. Further, when the mobility of the transistor μFE is 20 cm$^2$/Vs and the threshold voltage Vth is 0.6 V according to the data in FIG. 12 and when the gate voltage Vg is 3.3 V and the drain voltage Vd is 1.8 V as the specification example of the memory circuit, the on-state resistance Rd is 76.31 kΩ from the above formula (1).

The above is description of a structure example of each of the transistors illustrated in FIGS. 11A to 11C.

Figure 13A:
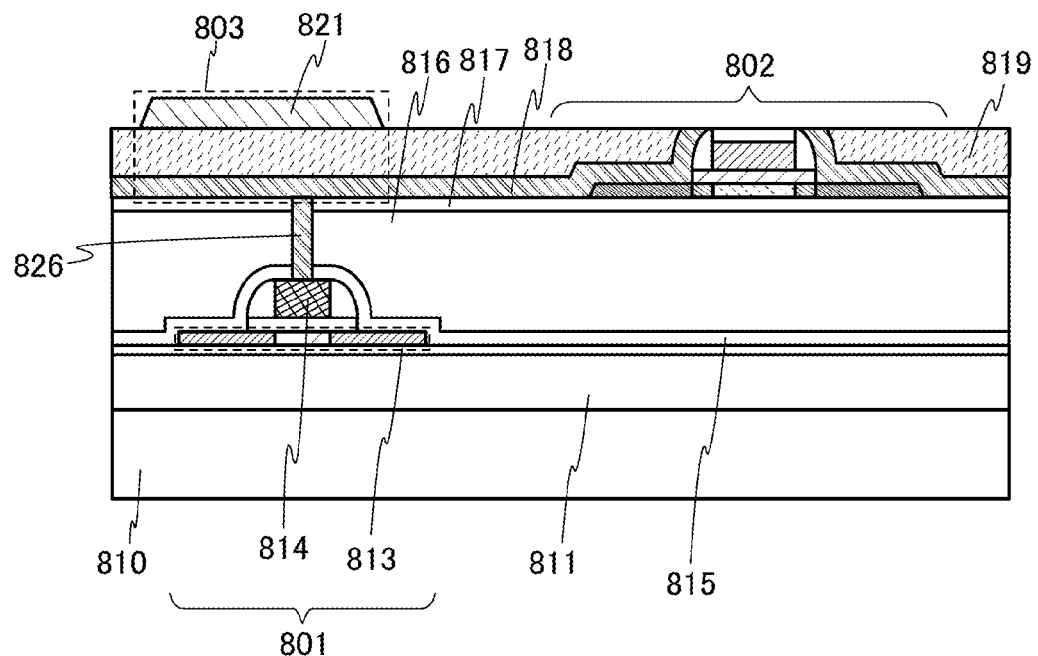
FIGS. 13A and 13B each illustrate an example of a semiconductor memory device included in a memory device in a semiconductor device.
Figure 13B:
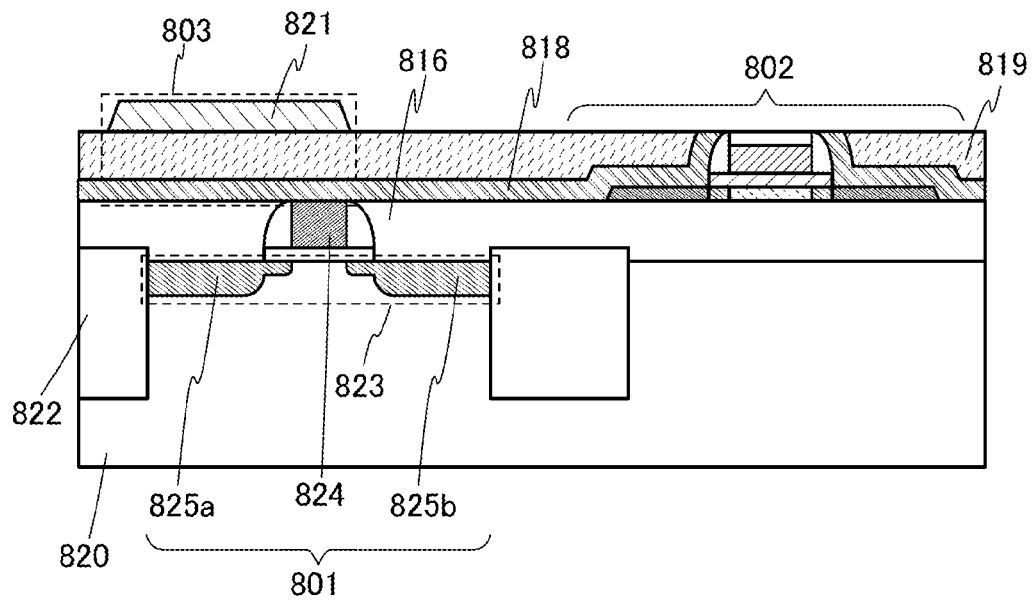

Further, the case where the transistor illustrated in FIG. 11A is employed for the semiconductor memory device of the memory circuit included in the semiconductor device which is one embodiment of the present invention (see FIG. 6) is described with reference to FIGS. 13A and 13B. FIGS. 13A and 13B are cross-sectional schematic views illustrating the structure examples of the memory circuit according to this embodiment. Note that one embodiment of the present invention is not limited thereto; a memory circuit may be formed using the transistors illustrated in FIGS. 11B and 11C.

The memory circuit illustrated in FIG. 13A includes a transistor 801 including a single crystal silicon layer 813 that is a channel formation layer, a transistor 802 that is stacked over the transistor 801 with insulating layers 815 to 817 placed therebetween and has the same structure as that illustrated in FIG. 11A, and a capacitor 803 formed through manufacturing steps of the transistor 801. Note that since the semiconductor memory device illustrated in FIG. 6 is used as an example here, the transistor 801 is a p-channel transistor, and the transistor 802 is an n-channel transistor. Note that the description of the transistor illustrated in FIG. 11A can apply to the transistor 802 as appropriate.

The single crystal silicon layer 813 is provided over a substrate 810 with an insulating layer (also referred to as BOX layer) 811 placed therebetween. Note that as illustrated in FIG. 13B, the transistor 801 may be composed of a semiconductor region 823 surrounded by a buried insulating region 822 in a single crystal semiconductor substrate 820, instead of using the substrate 810, the insulating layer 811, and the single crystal silicon layer 813. In this case, in the semiconductor region 823, impurity regions 825a and 825b whose conductivity is n-type or p-type are provided.

The insulating layer 815 serves as a protective layer. The insulating layer 816 functions both as a protective layer and as a planarization layer. The insulating layer 817 functions as a base layer. Each of the insulating layers 815 to 817 can be a layer containing a material similar to that of the insulating layer 701 illustrated in FIG. 11A.

A conductive layer 818 functioning as a source electrode or a drain electrode of the transistor 802 is connected to a conductive layer 814 functioning as a gate electrode of the transistor 801. Note that the conductive layer 818 and the conductive layer 814 may be connected to each other through a plurality of conductive layers. Note that the memory circuit may have the structure as shown in FIG. 13B in which the conductive layer 824 serving as the gate electrode of the transistor 801 has a direct contact with the conductive layer 818. Alternatively, the conductive layer 818 may be electrically connected to the conductive layer 814 through another conductive layer (e.g., a conductive layer 826) without direct contact between the conductive layers 818 and 814 (see FIG. 13A). Note that the conductive layer 826 is formed in the following manner: a layer including a material similar to that of the conductive layers 718a and 718b of the transistor illustrated in FIG. 11A; and the layer is planarized or etched.

Further, as the transistor 802, the transistor with extremely low off-state current can be used. For example, the conductive layer 818 corresponds to the conductive layer 718a of the transistor illustrated in FIG. 11A.

The capacitor 803 has a structure in which a dielectric is provided between a pair of conductive layers. One of the pair of conductive layers is the conductive layer 818, the other conductive layer is the conductive layer 821, and the dielectric is the insulating layer 819. The insulating layer 819 corresponds to the insulating layer 719 of the transistor illustrated in FIG. 11A. The conductive layer 821 has a structure similar to that of the conductive layer 818.

The above is the description of the structure example of the memory circuit illustrated in FIGS. 13A and 13B.

As described above, a transistor with extremely low off-state current can be formed by using an oxide semiconductor. In addition, the transistor including an oxide semiconductor is applied to a transistor included in a volatile memory, whereby the volatile memory can function as a nonvolatile memory which can be applied to a semiconductor memory device of a memory circuit included in the semiconductor device which is one embodiment of the present invention.

The structures, methods, and the like described in this embodiment can be combined with any of the other embodiments, as appropriate.

Embodiment 3

In this embodiment, examples of an electronic device provided with the semiconductor device which is one embodiment of the present invention will be described with reference to drawings. In addition to the processor described in the above embodiment, a register, a register controller, an instruction decoder, an interrupt controller, a timing controller, a bus interface, and the like are provided, whereby a semiconductor device including a CPU or DSP can be formed.

Figure 14A:
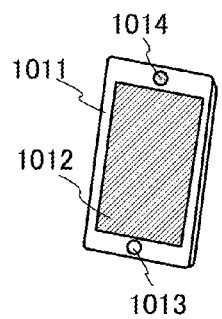
FIGS. 14A to 14F illustrate electronic devices.

Further, since the processor described in the above embodiment has superiority in cutting power consumption, in a semiconductor device including the processor, power consumption can be much lowered. FIGS. 14A to 14F illustrates specific examples of an electronic device including the semiconductor device;

The electronic device illustrated in FIG. 14A is an example of a personal digital assistant.

The electronic device illustrated in FIG. 14A includes a housing 1011 and a panel 1012, a button 1013, and a speaker 1014 which are provided for the housing 1011.

The housing 1011 may be provided with a connection terminal for connecting the electronic device to an external device and a button for operating the electronic device.

The panel 1012 is a display panel (display). The panel 1012 preferably has a function of a touch panel.

The button 1013 is provided for the housing 1011. When the button 1013 is a power button, for example, pressing the button 1013 can turn on or off the electronic device.

The speaker 1014 is provided for the housing 1011. The speaker 1014 has a function of outputting sound.

Note that the housing 1011 may be provided with a microphone, in which case the electronic device in FIG. 14A can function as a telephone, for example.

The electronic device in FIG. 14A includes the semiconductor device including the processor described in the above embodiment inside the housing 1011.

The electronic device illustrated in FIG. 14A functions as one or more of a telephone set, an e-book reader, a personal computer, and a game machine, for example.

Figure 14B:
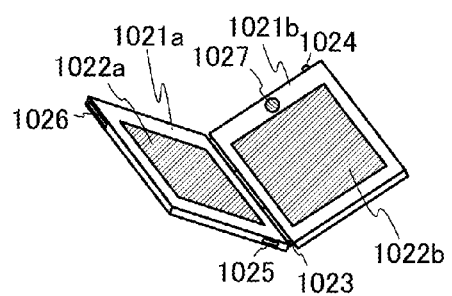

The electronic device illustrated in FIG. 14B is an example of a foldable information terminal.

The electronic device illustrated in FIG. 14B includes a housing 1021a, a housing 1021b, a panel 1022a provided for the housing 1021a, a panel 1022b provided for the housing 1021b, a hinge 1023, a button 1024, a connection terminal 1025, a storage medium inserting portion 1026, and a speaker 1027.

The housing 1021*a* and the housing 1021*b* are connected by the hinge 1023.

The panels 1022*a* and 1022*b* are display panels (displays). The panels 1022*a* and 1022*b* preferably have a function of a touch panel.

Since the electronic device in FIG. 14B includes the hinge 1023, it can be folded so that the panels 1022*a* and 1022*b* face each other.

The button 1024 is provided for the housing 1021*b*. Note that the housing 1021*a* may also be provided with the button 1024. For example, when the button 1024 which functions as a power button is provided and pushed, supply of a power voltage to the electronic device can be controlled.

The connection terminal 1025 is provided for the housing 1021*a*. Note that the housing 1021*b* may be provided with the connection terminal 1025. Further alternatively, a plurality of connection terminals 1025 may be provided on one or both of the housings 1021*a* and the housing 1021*b*. The connection terminal 1025 is a terminal for connecting the electronic device illustrated in FIG. 14B to another device.

The storage media inserting portion 1026 is provided for the housing 1021*a*. Note that the storage medium insertion portion 1026 may be provided on the housing 1021*b*. Alternatively, the plurality of recording medium insertion portions 1026 may be provided for one or both of the housings 1021*a* and 1021*b*. For example, a card-type recording medium is inserted into the recording medium insertion portion so that data can be read to the electronic device from the card-type recording medium or data stored in the electronic device can be written to the card-type recording medium.

The speaker 1027 is provided for the housing 1021*b*. The speaker 1027 outputs sound. Note that the speaker 1027 may be provided for the housing 1021*a*.

Note that the housing 1021*a* or the housing 1021*b* may be provided with a microphone, in which case the electronic device in FIG. 14B can function as a telephone, for example.

The electronic device in FIG. 14B includes the semiconductor device including the processor described in Embodiment 1 inside the housing 1021*a* or the housing 1021*b*.

The electronic device illustrated in FIG. 14B functions as one or more of a telephone set, an e-book reader, a personal computer, and a game machine, for example.

Figure 14C:
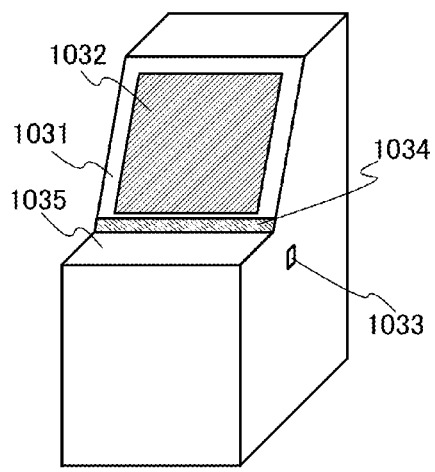

The electronic device illustrated in FIG. 14C is an example of a stationary information terminal. The stationary information terminal illustrated in FIG. 14C includes a housing 1031, and a panel 1032, a button 1033, and a speaker 1034 that are provided for the housing 1031.

The panel 1032 is a display panel (display). The panel 1032 preferably has a function of a touch panel.

Note that a panel similar to the panel 1032 may be provided for a deck portion 1035 of the housing 1031. This panel preferably has a function of a touch panel.

The housing 1031 may be provided with one or more of a ticket slot from which a ticket or the like is dispensed, a coin slot, and a bill slot.

The button 1033 is provided for the housing 1031. For example, when the button 1033 is a power button, supply of a power voltage to the electronic device can be controlled by pressing the button 1033.

The speaker 1034 is provided for the housing 1031. The speaker 1034 has a function of outputting sound.

The electronic device in FIG. 14C includes the semiconductor device including the processor described in Embodiment 1 inside the housing 1031.

The electronic device illustrated in FIG. 14C has, for example, a function as an automated teller machine, an information communication terminal for ordering a ticket or the like (also referred to as a multi-media station), or a game machine.

Figure 14D:
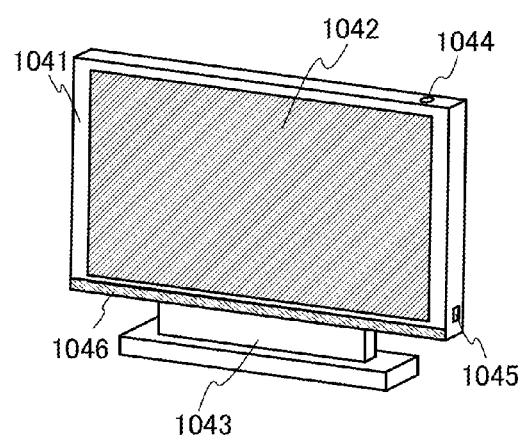

FIG. 14D illustrates an example of a stationary information terminal. The electronic device illustrated in FIG. 14D includes a housing 1041, a panel 1042 incorporated in the housing 1041, a support 1043 for supporting the housing 1041, a button 1044, a connection terminal 1045, and a speaker 1046.

Note that a connection terminal for connecting the housing 1041 to an external device may be provided.

The panel 1042 has a function as a display panel (display).

The button 1044 is provided for the housing 1041. For example, when the button 1044 is a power button, supply of a power voltage to the electronic device can be controlled by pressing the button 1044.

The connection terminal 1045 is provided for the housing 1041. The connection terminal 1045 is a terminal for connecting the electronic device illustrated in FIG. 14D to another device. For example, when the electronic device in FIG. 14D and a personal computer are connected with the connection terminal 1045, the panel 1042 can display an image corresponding to a data signal input from the personal computer. For example, when the panel 1042 of the electronic device in FIG. 14D is larger than a panel of another electronic device connected thereto, a displayed image of the other electronic device can be enlarged, so that a plurality of viewers can easily see the image at the same time.

The speaker 1046 is provided for the housing 1041. The speaker 1046 has a function of outputting sound.

The electronic device in FIG. 14D includes the semiconductor device including the processor described in Embodiment 1 inside the housing 1041.

The electronic device illustrated in FIG. 14D functions as, for example, an output monitor, a personal computer, and/or a television set.

Figure 14E:
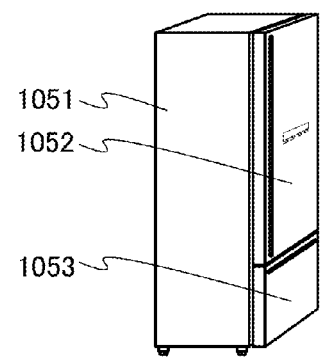

FIG. 14E illustrates an example of an electric refrigerator-freezer. The electronic device illustrated in FIG. 14E includes a housing 1051, a refrigerator door 1052, and a freezer door 1053.

The electronic device in FIG. 14E includes the semiconductor device including the processor described in Embodiment 1 inside the housing 1051. With this structure, supply of a power voltage to the semiconductor device in the housing 1051 can be controlled in response to opening and closing of the refrigerator door 1052 and the freezer door 1053, for example.

Figure 14F:
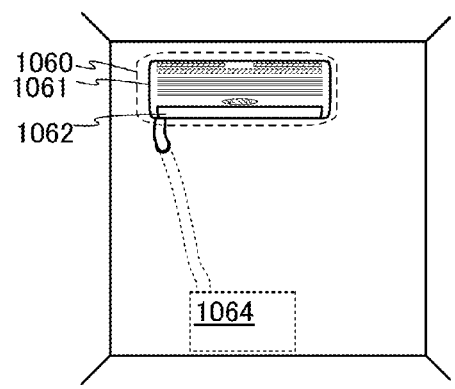

FIG. 14F illustrates an example of an air conditioner. The electronic device illustrated in FIG. 14F includes an indoor unit 1060 and an outdoor unit 1064.

The indoor unit 1060 includes a housing 1061 and a ventilation duct 1062.

The electronic device in FIG. 14F includes the semiconductor device including the processor described in Embodiment 1 inside the housing 1061. With this structure, supply of a power voltage to the semiconductor device in the housing 1061 can be controlled in response to a signal from a remote controller, for example.

Note that although the separated air conditioner including the indoor unit and the outdoor unit is shown in FIG. 14F as an example, it may be an air conditioner in which the functions of an indoor unit and an outdoor unit are integrated in one housing.

Examples of the electronic devices are not limited to the above, and the semiconductor device including the processor described in the above embodiment can also be applied to a high-frequency heating apparatus such as a microwave oven, an electric rice cooker, and the like.

As described above, with use of a semiconductor device including the processor described in the above embodiment, an electronic device having superiority in cutting low power consumption can be manufactured.

The structures, methods, and the like described in this embodiment can be combined with any of the other embodiments, as appropriate.

This application is based on Japanese Patent Application serial no. 2012-050085 filed with Japan Patent Office on Mar. 7, 2012, the entire contents of which are hereby incorporated by reference.

What is claimed is:

1. A semiconductor device comprising:
   a substrate;
   an oxide semiconductor layer over the substrate, the oxide semiconductor layer including a channel formation region, a source region, a drain region and a region;
   a gate electrode overlapping with the channel formation region with a gate insulating layer therebetween;
   a side wall adjacent to a side surface of the gate electrode, the side wall overlapping with the region; and
   an electrode overlapping with the source region and a side surface of the sidewall,
   wherein the region is provided between the channel formation region and one of the source region and the drain region, and
   wherein top surfaces of the gate electrode and the electrode are substantially in conformity to each other.

2. The semiconductor device according to claim 1, wherein the oxide semiconductor layer comprises gallium.

3. The semiconductor device according to claim 1, wherein the oxide semiconductor layer comprises indium, gallium and zinc.

4. The semiconductor device according to claim 1, wherein a carrier density of the oxide semiconductor layer is lower than $1 \times 10^{14}/cm^3$.

5. The semiconductor device according to claim 1, wherein the semiconductor device is incorporated into a memory element.

6. A semiconductor device comprising:
   a first transistor comprising:
      a first channel formation region including a semiconductor material;
      first impurity regions with the first channel formation region therebetween;
      a first gate insulating layer over the first channel formation region;
      a first gate electrode overlapping with the first channel formation region with the first gate insulating layer therebetween; and
      a first source electrode or a first drain electrode electrically connected to one of the first impurity regions; and
   a second transistor comprising:
      an insulating layer over the first transistor;
      an oxide semiconductor layer over the insulating layer, the oxide semiconductor layer including a second channel formation region, second impurity regions and a region;
      a second gate electrode overlapping with the second channel formation region with a second gate insulating layer therebetween;
      a side wall adjacent to a side surface of the second gate electrode, the side wall overlapping with the region; and
      a second source electrode or a second drain electrode overlapping with one of the second impurity regions and a side surface of the sidewall,
   wherein the region is sandwiched between the second channel formation region and the one of the second impurity regions,
   wherein top surfaces of the second gate electrode and the second source electrode or the second drain electrode are substantially in conformity to each other, and
   wherein the second source electrode or the second drain electrode is electrically connected to the first gate electrode.

7. The semiconductor device according to claim 6, wherein the oxide semiconductor layer comprises gallium.

8. The semiconductor device according to claim 6, wherein the oxide semiconductor layer comprises indium, gallium and zinc.

9. The semiconductor device according to claim 6, wherein a carrier density of the second channel formation region of the oxide semiconductor layer is lower than $1 \times 10^{14}/cm^3$.

10. The semiconductor device according to claim 6, wherein the semiconductor device is incorporated into a memory element.

11. A semiconductor device comprising:
    a first transistor comprising:
       a first channel formation region including a semiconductor material;
       first impurity regions with the first channel formation region therebetween;
       a first gate insulating layer over the first channel formation region;
       a first gate electrode overlapping with the first channel formation region with the first gate insulating layer therebetween; and
       a first source electrode or a first drain electrode electrically connected to one of the first impurity regions; and
    a second transistor comprising:
       an insulating layer over the first transistor;
       an oxide semiconductor layer over the insulating layer, the oxide semiconductor layer including a second channel formation region, second impurity regions and a region;
       a second gate electrode overlapping with the second channel formation region with a second gate insulating layer therebetween;
       a second insulating layer on the second gate electrode;
       a side wall adjacent to a side surface of the second gate electrode, the side wall overlapping with the region; and
       a second source electrode or a second drain electrode overlapping with one of the second impurity regions and a side surface of the sidewall,
    wherein the region is sandwiched between the second channel formation region and the one of the second impurity regions,
    wherein top surfaces of the second insulating layer and the second source electrode or the second drain electrode are substantially in conformity to each other, and
    wherein the second source electrode or the second drain electrode is electrically connected to the first gate electrode.

12. The semiconductor device according to claim 11, wherein the oxide semiconductor layer comprises gallium.

13. The semiconductor device according to claim 11, wherein the oxide semiconductor layer comprises indium, gallium and zinc.

14. The semiconductor device according to claim 11, wherein a carrier density of the second channel formation region of the oxide semiconductor layer is lower than $1\times10^{14}/cm^3$.

15. The semiconductor device according to claim 11, wherein the semiconductor device is incorporated into a memory element.

* * * * *